United States Patent
Kanai

[19]

[11] Patent Number: 6,038,521
[45] Date of Patent: Mar. 14, 2000

[54] QUALITY TEST SYSTEM FOR ELECTRIC APPLIANCES

[75] Inventor: Hiroshi Kanai, Saitama, Japan

[73] Assignee: Sanyo Electric Co., Ltd., Moriguchi, Japan

[21] Appl. No.: 08/951,110

[22] Filed: Oct. 15, 1997

[30] Foreign Application Priority Data

Oct. 18, 1996 [JP] Japan .................................. 8-295937
Oct. 18, 1996 [JP] Japan .................................. 8-295938

[51] Int. Cl.$^7$ .............................. B23P 23/00; G01L 25/00
[52] U.S. Cl. .......................... 702/121; 702/118; 702/122; 73/865.8; 73/865.9
[58] Field of Search ..................................... 702/118, 121, 702/122, 123; 73/865.8, 865.9

[56] References Cited

U.S. PATENT DOCUMENTS

| | | |
|---|---|---|
| 3,648,819 | 3/1972 | Converse, III et al. . |
| 5,042,265 | 8/1991 | Baldwin et al. ............................ 62/127 |
| 5,469,750 | 11/1995 | Lloyd et al. .......................... 73/861.61 |
| 5,571,978 | 11/1996 | Gysi et al. .............................. 73/865.8 |
| 5,824,921 | 10/1998 | Kanai ...................................... 73/865.8 |

FOREIGN PATENT DOCUMENTS

| | | |
|---|---|---|
| 0 572 940 | 12/1993 | European Pat. Off. . |
| 26 19 228 | 5/1977 | Germany . |
| 37 13 155 | 11/1988 | Germany . |
| 2 027 216 | 2/1980 | United Kingdom . |

OTHER PUBLICATIONS

Patent Abstracts of Japan, vol. 14, No. 238 (P–1050), May 21, 1990 & JP 02 061535 A (Toshiba Corp), Mar. 1, 1990.
Patent Abstracts of Japan, vol. 13, No. 368 (P–919), Aug. 16, 1989 & JP 01 124743 A (Toshiba Corp), May 17, 1989.

*Primary Examiner*—Marc S. Hoff
*Assistant Examiner*—Bryan Bui
*Attorney, Agent, or Firm*—Armstrong, Westerman, Hattori, McLeland & Naughton

[57] ABSTRACT

A test system for testing the quality of electric appliances includes a test line having an endless conveyer which is provided with a multiplicity of carts, a reception terminal for receiving electric appliances from a first assembly line on which the electric appliances were assembled, and an exit terminal for releasing the appliances to a second assembly line after they are tested. The reception and the exit terminals are connected with the assembly lines in response to a run signal instructing the operation of the test line. When the electric appliances are received at the reception terminal, they are each mounted on one of the carts for circulation in intermittent movement in response to the run signal. Located along the endless conveyor are a multiplicity of test stations, which are adapted to carry out required tests when the appliances are transported to the stations. Once a test is done on an electric appliance, the same test will not be repeated on the same electric appliance. The endless conveyor is disconnected from the assembly lines in response to a stop signal instructing the stopping of the test line, so that the conveyor becomes independent of the assembly lines and circulates the electric appliances in the test line. When the test line receives the stop signal, each of the electric appliances are allowed to make a complete circulation through the test line, starting from the position located at the time of reception of the stop signal, to complete pending tests, and then the test line is stopped. The test line may be incorporated in an assembly line, thereby improving the production efficiency of the lines.

5 Claims, 22 Drawing Sheets

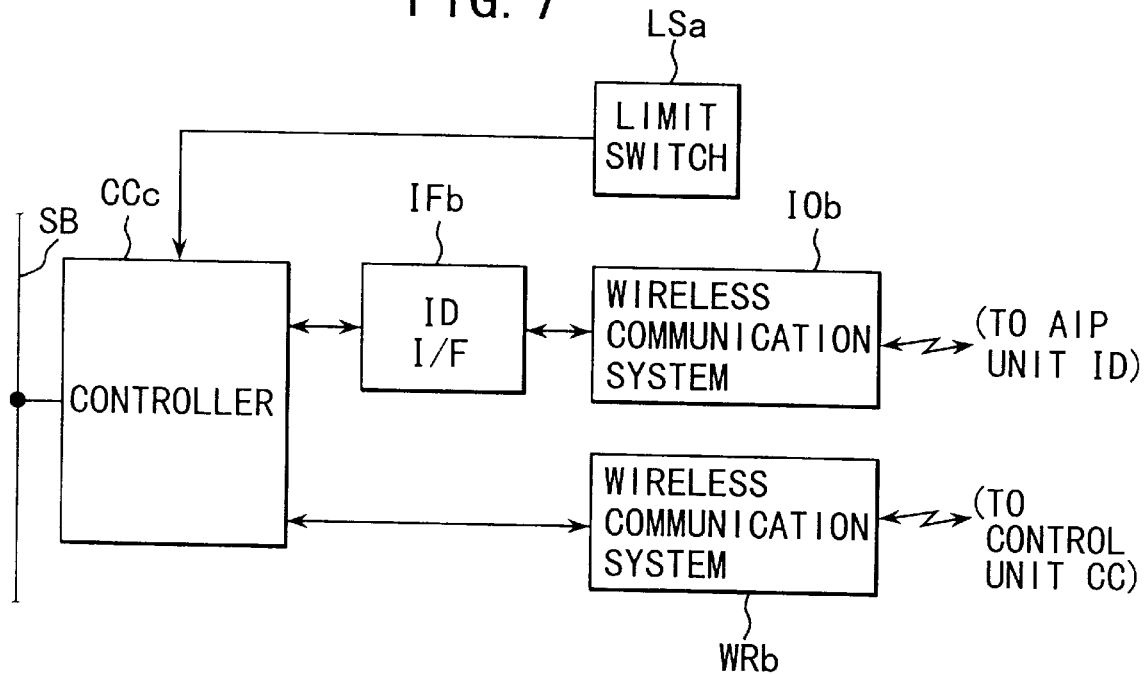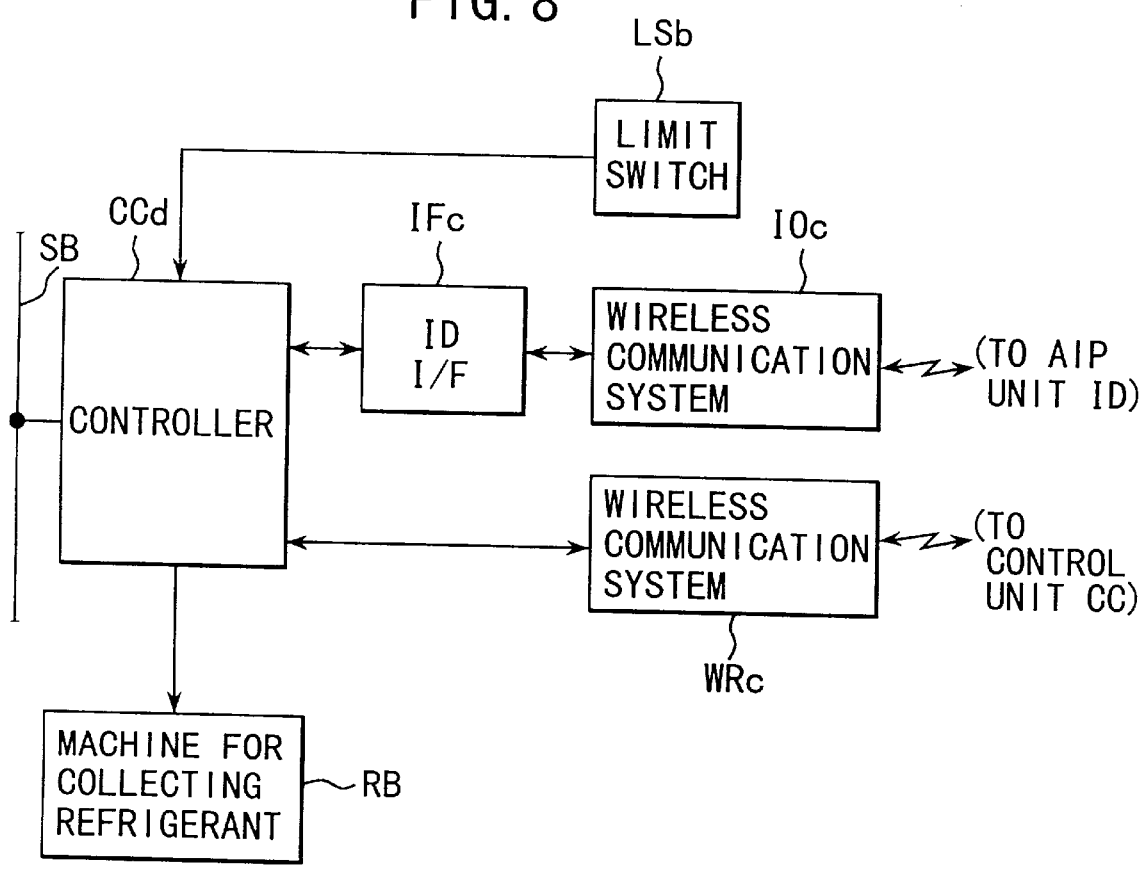

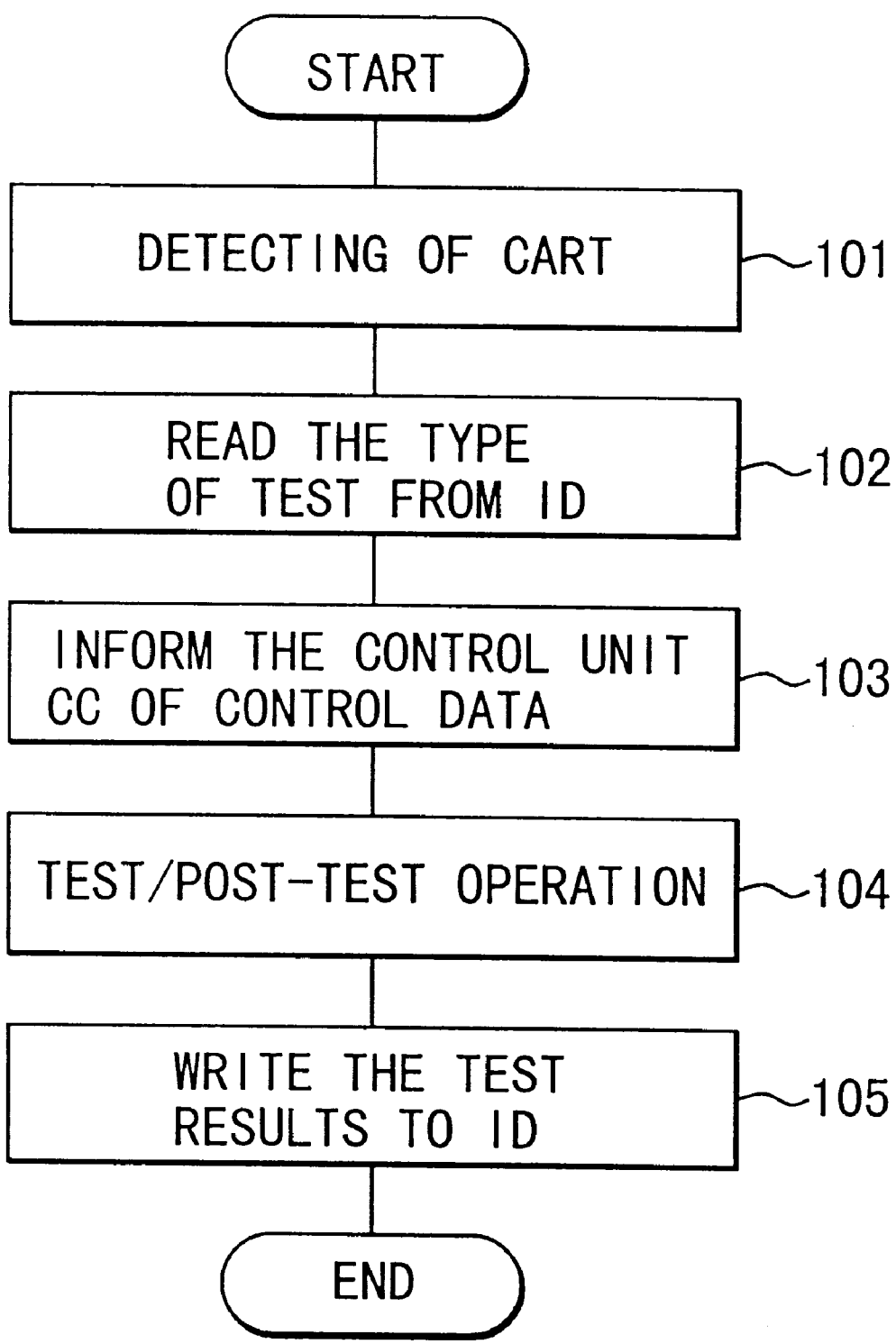

FIG. 12

| SYMPTOMS | ELECTRIC CURRENT | LOW PRESSURE |
|---|---|---|
| 1. EXPANSION VALVE (CAPILLARY TUBE) HAS BEEN CLOGGED | FALLS | FALLS EXCESSIVELY |
| 2. FAN OF THE OUTDOOR UNIT HAS STOPPED | RISES EXCESSIVELY | RISES |
| 3. REFRIGERANT IS INSUFFICIENT | FALLS | FALLS |
| 4. OIL IS INSUFFICIENT | RISES | RISES A LITTLE |
| 5. WATER MIXED IN THE REFRIGERANT | UNDERGOES HUNTING | UNDERGOES GREAT HUNTING |

QUALITY TEST SYSTEM FOR ELECTRIC APPLIANCES

FIELD OF THE INVENTION

The invention relates to a method and an apparatus for determining the capacities or qualities of assembled electric appliances while they are in an assembly line, and more particularly, to such method and apparatus for testing capacities of electric cooling/refrigeration units (herein after simply referred to as refrigeration unites).

BACKGROUND OF THE INVENTION

Most commonly, electric appliances such as air conditioners are first assembled in an assembly line and then brought to an independent test station, where they are tested to see whether they have required quality. The test line is not incorporated in the assembly line because such tests must be done while the air conditioner under test is operating in a steady state condition in order to obtain reliable test data, and because the assembly line cannot stand by until the air conditioner reaches the steady state on the assembly line.

These tests are preferably carried out sequentially in a given time without interruption after the air conditioner has been put in operation, since otherwise some of the control parameters of the tests might change during the tests, which makes the tests unreliable. In actuality, however, the assembly line is often stopped and slow down on account of periodic recesses, for example, and occasional troubles.

Therefore, it has been difficult to incorporate a test line in an assembly line, from the point of production efficiency of the assembly line for air conditioners.

In view of these problems, the present invention is directed to a new test system that may be incorporated in an assembly line, for carrying out necessary quality tests of electric appliances.

SUMMARY OF THE INVENTION

To this end, in accordance with the invention, there is provided a test system for testing the quality of electric appliances, comprising:

a test line having an endless conveyer which is provided with a multiplicity of carts, a reception terminal for receiving electric appliances from a first assembly line on which the electric appliances were assembled, and an exit terminal for releasing the appliances to a second assembly line after they are tested;

means for connecting the reception and exit terminals with the first and second assembly lines in response to a run signal instructing the operation of the test line;

test line initiation means for mounting each of the electric appliances received at the reception terminal onto one of the multiplicity of carts and for circulating the carts in intermittent movement in response to the run signal;

a multiplicity of test stations located along the endless conveyor, each test station adapted to carry out required tests when the appliances are transported to the station;

regulation means for prohibiting repetition of the same test on one electric appliance once the test has been done on the electric appliance in the test line;

means for disconnecting the endless conveyor from the first and second assembly lines in response to a stop signal instructing the stopping of the test line, thereby rendering the conveyor independent in operation from the assembly lines and circulating the electric appliances in the test line; and means for stopping the test line, in response to the stop signal, when each of the electric appliances has made a complete circulation through the test line, starting from the position located at the time of reception of the stop signal.

With this test line, it is possible to incorporate the test line in assembly lines so that these lines may run and stop together and may greatly shorten shipping time for the electric appliances.

The tests to be performed in the test stations may include preparations for fluid and electric connections involved in the tests by means of tubes and wires; procedures to carry out the tests; steps to bring the tested electric appliance back to its original condition after the tests, collecting and storing the results of the tests, and making an overall determination of the tests based on the results.

Each of the carts is provided with an appliance information processor (AIP) unit and a controller described below. The AIP unit is adapted to: store information that concerns the electric appliance carried on the cart and is input in a monitor at the reception terminal; retrieve such information as the type of the appliance, needed for the test to be performed at each test station; provide the information to the controller when the cart is detected at the test station so that the controller may control the appliance based on the information; store the results of the test; and provide the results to a general determination unit at the exit of the test line.

With these AIP unit and controller, it is possible to carry out speedy and appropriate quality tests on the electric appliances with minimum manpower, and maintain high quality of the products.

Information that needs to be exchanged between the test stations and the AIP unit and the controller on the cart may be attained by a radio communication system. Such radio communication system will facilitate data transfer between moving carts and fixed test stations.

When dealing with outdoor units of air conditioners, each of the cart may have an indoor unit which may be fluid-mechanically and electrically connected with the outdoor door unit by means of a tube/wire connector when the outdoor unit received from an assembly line is mounted on one of the carts. The test line preferably has four test stations so that the outdoor unit is tested to see if the unit: has required insulation resistance, at the first test station; may start up at a low voltage at the second test station; may operate in a normal heating mode at the third test station; and operate in a normal cooling mode at the fourth test station. The test line has further stations, a first and a second post-test stations. The refrigerant of the outdoor unit may be recovered at the first post-test station, and the outdoor unit is stopped at a second post-test station. The tube/wire connector is then disconnected from the outdoor unit.

BRIEF DESCRIPTION OF THE DRAWINGS

The present invention may be best understood by reference to the following detailed description of exemplary embodiments when considered in conjunction with the drawings in which:

FIG. 7 is a block diagram showing the basic structure of test stations ST1 through ST4.

FIG. 8 is a block diagram showing the basic structure of post-test stations ST5 and ST6.

FIG. 9 is a flowchart illustrating data processing procedure for a typical test conducted in the test station.

FIG. 12 is a table form of data showing abnormal symptoms in terms of the electric current (indicative of power consumption) and the corresponding refrigerant pressure at the low-pressure end of the compressor.

DETAILED DESCRIPTION OF THE PREFERRED EMBODIMENT

Figure 1:
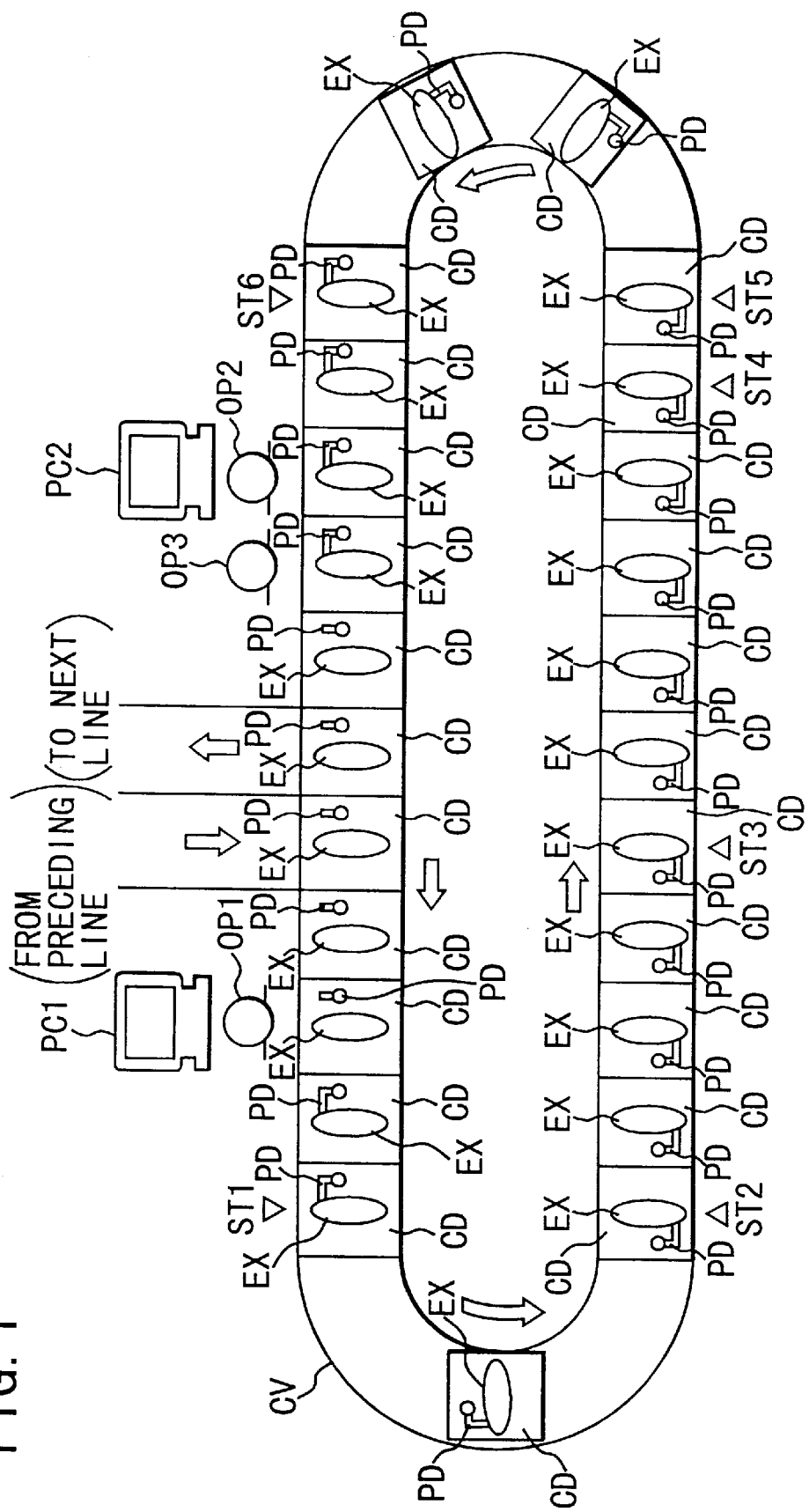
FIG. 1 a schematic view of a test system embodying the invention used in conjunction with an air conditioner.

Referring now to FIG. 1, there is shown a test line provided within assembly lines for electric appliances, more particularly for outdoor units EX of separate type air conditioners. The test line is capable of carrying out quality tests or capacity tests for different types of refrigeration units having different refrigeration powers.

A conveyer CV having a multiplicity of carts CD (as many as twenty five carts in this example) is capable of transporting the carts in intermittent movement in the counterclockwise direction for 6 seconds, for example, after every 12-second pause.

Each of the carts is provided on the underside thereof with a dummy indoor unit DM (which will be described in detail in connection with FIG. 2). An outdoor unit EX is fed from a preceding assembly line (not shown) to the conveyer CV. At the import end of the conveyer, the outdoor unit EX is mounted on a palette PL (not shown) which is in turn mounted on one of the carts CD. The outdoor unit EX is then connected with the indoor unit installed on the cart using a tube/wire connector PD. The tube/wire connector PD is designed to provide fluid connection and electric power connection as well as signal connection between them. The cart CD is further provided with a slider (not shown in FIG. 1), through which electric power is supplied to the indoor unit and the outdoor unit EX.

Figure 2:
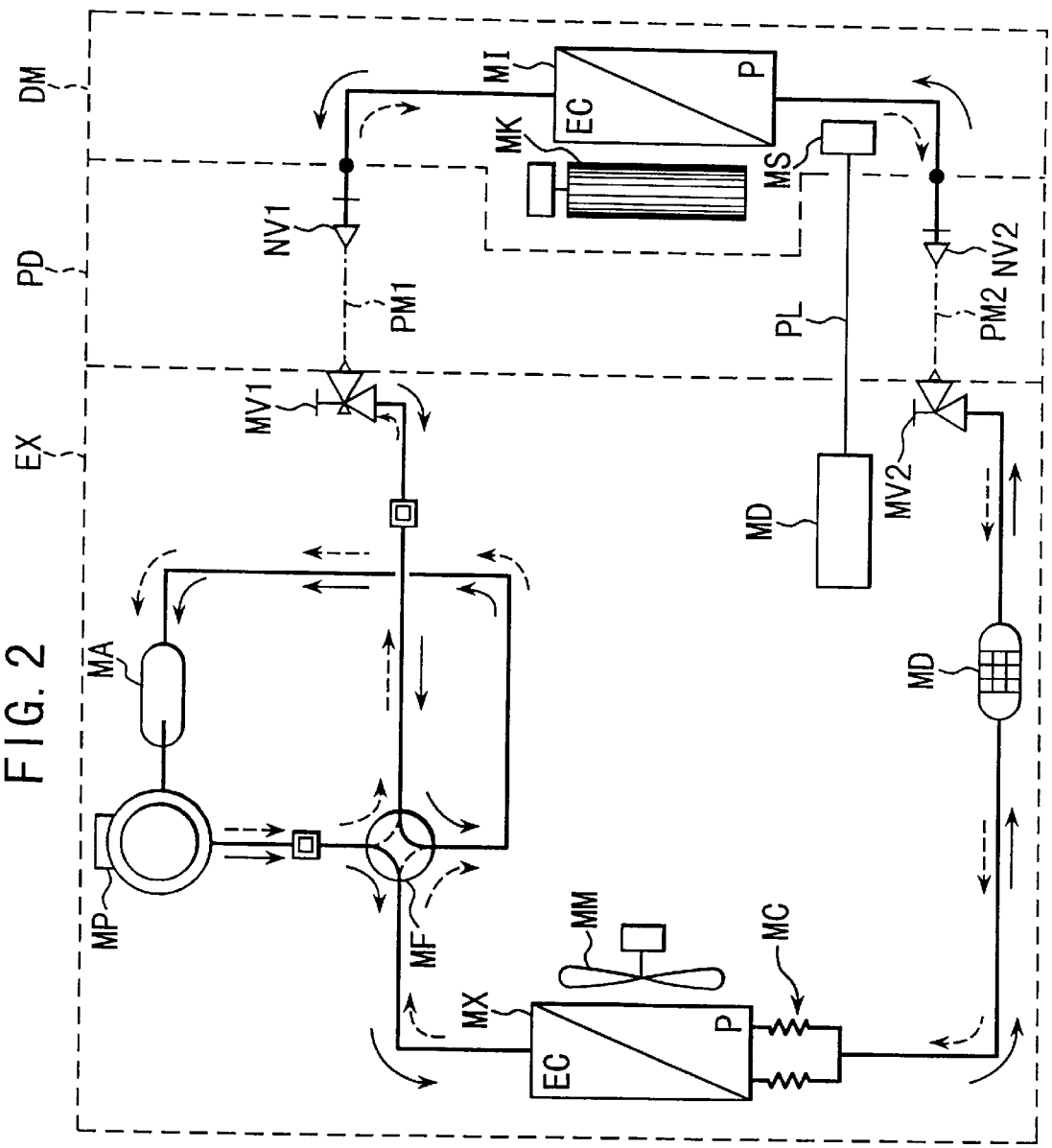
FIG. 2 is a block diagram representation showing the general structure of an air conditioner including an outdoor unit EX, an indoor unit DM, and tube/wire connector PD.

FIG. 2 shows a basic structure of an exemplary air conditioner that comprises an outdoor unit EX, an indoor unit DM, and a tube/wire connector PD described above. As shown in this figure, the outdoor unit EX includes a compressor MP, a four-way valve MF, an outdoor heat exchanger MX, a fan MM, a capillary tube MC, a modulator/strainer MD, manual valves MV1 and MV2, an accumulator MA, and a control unit MD.

The indoor unit DM includes an indoor heat exchanger MI, a cross flow fan MK, and a controller MS.

The tube/wire connector PD includes: a manual valve NV1 and a large-diameter tube PM1 for connecting the EC of the indoor heat exchanger MI with the manual valve MV1; the manual valve MV2 and a small-diameter tube PM2 for connecting the P of the indoor heat exchanger MI with the manual valve MV2; and a signal line PL for connecting the controller MD of the outdoor unit EX with the controller MS of the indoor unit DM.

As any one of the carts CD of FIG. 1 is advanced by two moves or two steps by the conveyer CV from the import end thereof to the location of an operator OP1 in the test line, the operator OP1 connects the outdoor unit EX with the tubes PM1 and PM2 of the tube/wire connector PD which have been already connected with the indoor unit DM of the cart CD. The cart CD is then moved two steps further to a first test station ST1 by the conveyer CV, where the outdoor unit EX is tested to see if the unit EX has required insulation resistance against a prescribed high voltage impressed on the electric terminals (not shown) of the outdoor unit EX.

The cart CD is then moved two steps further by the conveyer to a second test station ST2, where the outdoor unit EX is subjected to start up test for low-voltage, in which the outdoor unit EX is energized by, for example, 85% of the nominal voltage to see if the compressor MP of the outdoor unit EX can start its operation as required. It should be noted that in this test the air conditioner is set in a heating mode.

Next, the cart CD is moved four steps by the conveyer CV to a third test station ST3, where a heating capacity test is conducted on the outdoor unit EX to see if the unit has required heating power at the time 60 seconds after the start up by measuring the electric current through the compressor MP (which is indicative of electric power consumption by the compressor MP) and the refrigerant pressure at the low-pressure end of the compressor MP. Subsequent to the heating capacity test, a four-way valve MF is switched for a cooling mode of the outdoor unit EX. This switching of the operational mode of the unit from the heating mode to the cooling mode may be done without stopping the compressor MP.

The cart CD is again moved by five steps to a fourth test station ST4, where the outdoor unit EX is tested if it has sufficient refrigeration power 78 seconds after the start up of the cooling mode by measuring the electric power consumption by the compressor MP (or electric current through it) and the refrigerant pressure at the low-pressure end of the compressor MP.

Afterwards, the cart CD is advanced one step further by the conveyer CV to a post-test station ST5, where the outdoor unit EX is put in a first refrigerant recovery procedure for recovering the refrigerant that has flown out of the outdoor unit EX to the dummy indoor unit MD back to the outdoor unit EX. The refrigerant is pumped down by machine for collecting refrigerant (not shown) from the indoor unit MD to the outdoor unit EX. The procedure is started while the cart is in this station by shutting down the manual valve MV2 of the small-diameter tube PM2 and pumping down the refrigerant from the indoor unit MD.

As the cart CD is move by the conveyer CV three more steps, it reaches a sixth station or post-test station ST6 where a second refrigerant recovery procedure is initiated to finish the pumping down of the refrigerant. At the end of the second refrigerant recovery procedure, the machine shuts the large-diameter tube PM1, and stops the operation of the compressor MP.

When the cart CD is moved two step further to the location of a second operator OP2, the operator OP2 makes a general determination, after which the cart CD is further moved by one step by the conveyer CV to a third operator OP3, who disconnects the tube/wire connector PD from the outdoor unit EX.

The cart CD then proceeds two more steps to the exit port of the conveyor CV, where the outdoor unit EX is dismounted from the cart CD together with the palette, and carried away to a subsequent assembly line.

It is worth while to note that a monitor PC1 (referred to as object monitor) is provided in the neighborhood of the operator OP1 to indicate to the operator OP1 such data as the type of an object (which is in this example an outdoor unit EX) on the cart, modes of connections of the tubes and the electric wires involved. The data have been stored in an appliance information processor (AIP) unit ID described later for each type of objects.

A general determination unit PC2 is installed near the operator OP2 to indicate to the operator OP2 necessary data and the results of the tests done on the outdoor unit EX on the cart CD in front of him, so that the operator OP2 can make his determination easier. The data and the test results to be indicated on the general determination unit PC2 have been also stored in the AIP unit ID.

Figure 3:
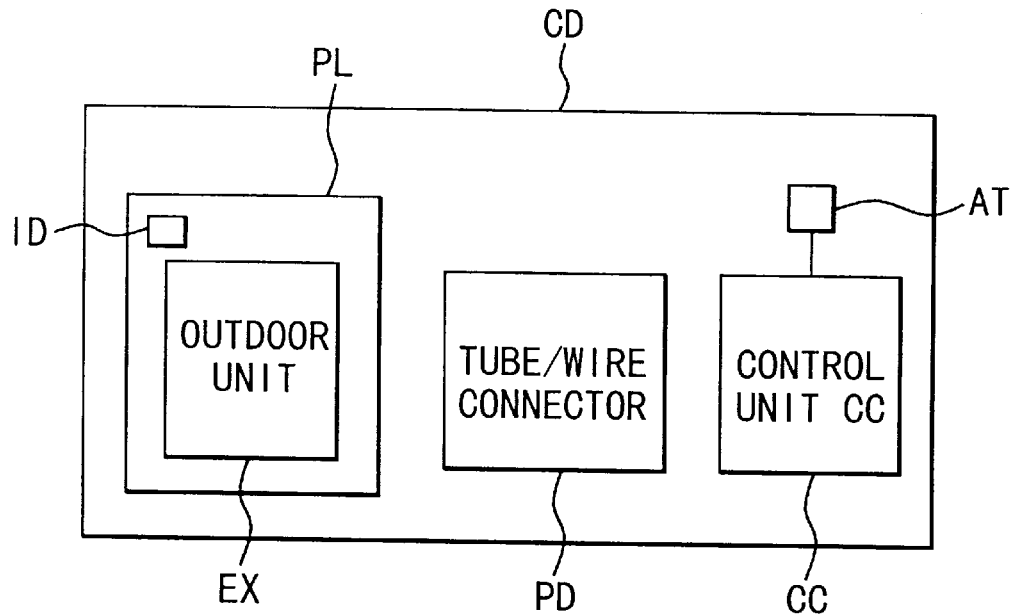
FIG. 3 is a block diagram showing the basic structure of a cart for carrying the air conditioner in the test system.

Referring to FIG. 3, there is shown a basic structure of a typical cart CD. As shown in this figure, the outdoor unit EX mounted on a palette PL is further mounted on the cart CD. The cart CD is provided with a tube/wire connector PD, a controller CC, and an antenna AT for transmission/reception of necessary data between the wireless communication system (described later) of the cart and the stations ST1–ST6. The palette PL is provided with an AIP unit ID (in the form of IC card, for example) for storing information concerning the outdoor unit EX.

Figure 4:
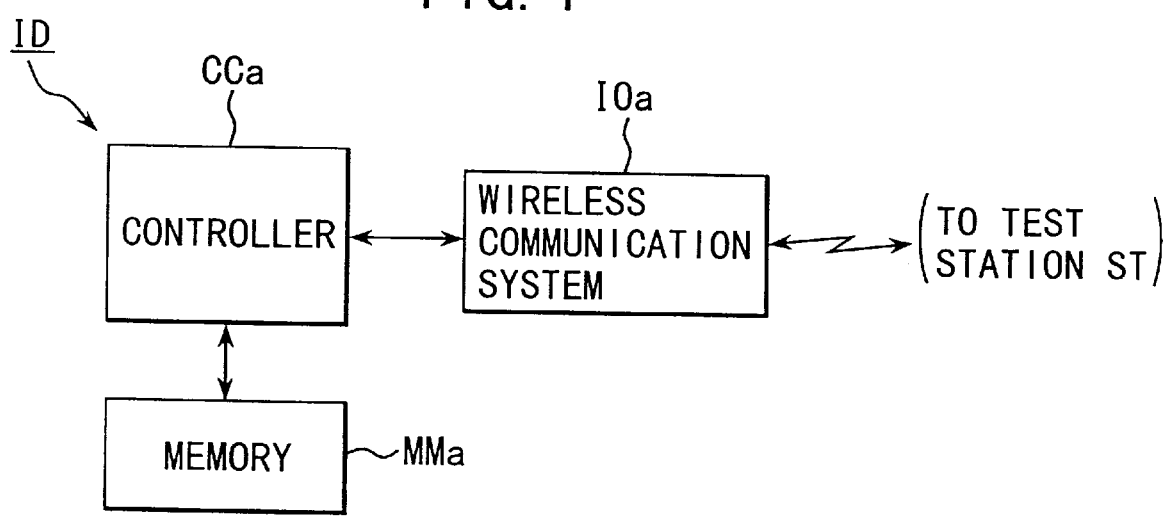
FIG. 4 is a block diagram showing the basic structure of an information processing unit of the test system.

FIG. 4 shows a basic structure of the AIP unit ID. The AIP unit ID is provided with a controller CCa for controlling the AIP unit ID, a memory MMa for storing information concerning individual outdoor units EX on the palettes PL. Included in the information are such data as the type, model number, and body identification code of the outdoor unit EX as well as kinds of tests and post-test operations to be performed in the test stations ST1–ST4 and the post-test stations ST5–ST6. The stations ST1–ST6 carry out respective tests and post-test operations based on the individual data. The results of the tests and determinations made are written in the AIP unit ID by the test stations ST2, ST3, and ST6, while the other data are stored in the memory MMa when the outdoor unit EX is mounted on the palette PL.

The AIP unit ID is also provided with a wireless communication system IOa which is capable of exchanging various data with the stations ST1–ST6 needed by the controller CCa. The data includes information concerning the outdoor unit EX, results of the tests, and the determinations made for the outdoor unit EX.

Figure 5:
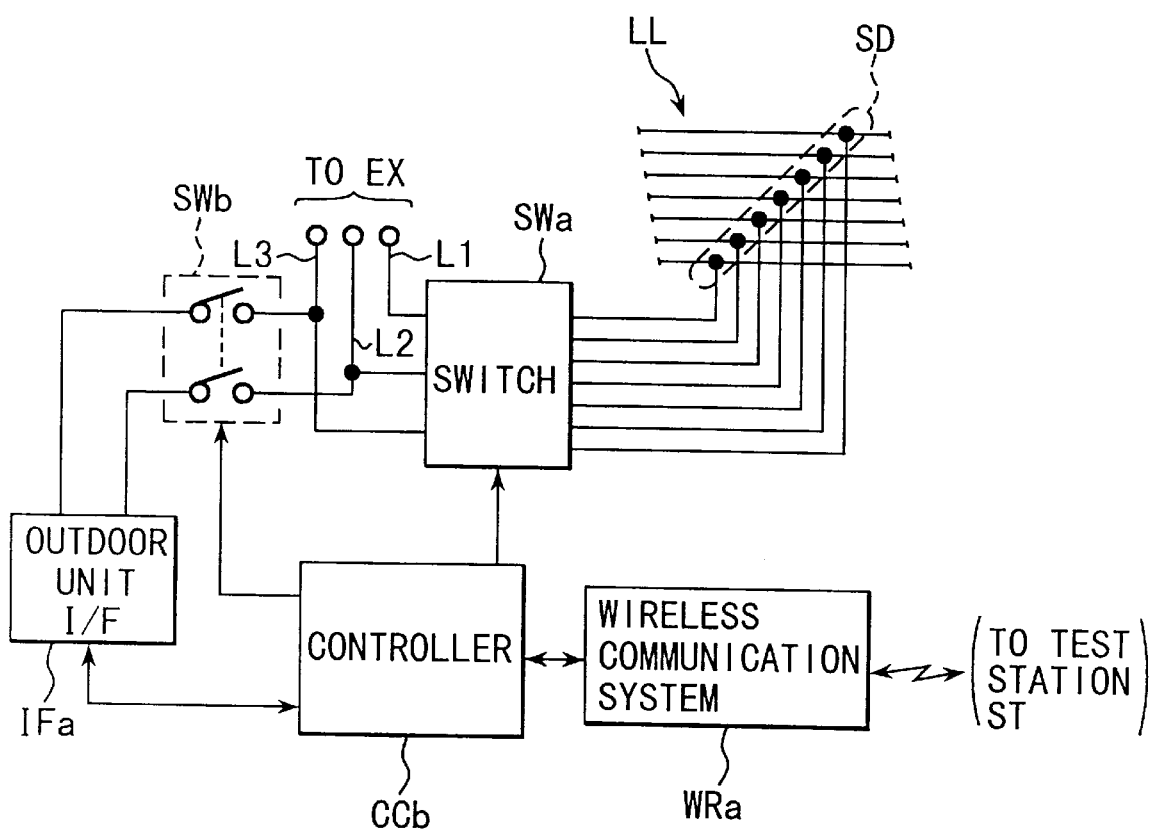
FIG. 5 is a block diagram showing the basic structure of a control system for the cart.

FIG. 5 shows a basic structure of the control unit CC of the cart CD. The unit is provided with a controller CCb for controlling the operations of the control unit CC. A wireless communication system WRa is provided for radio communication with the stations ST1–ST6 for exchanging necessary information, via an antenna AT (FIG. 3). It is noted that the stations ST1–ST6 are adapted to instruct the controller CCb to undertake necessary actions to carry out the tests and post-test operations based on the data stored in the AIP unit ID. Upon completion of the tests, the controller CCb returns the results of the tests and post-test operations to the stations ST1–ST6 as required. The stations then store the test results in the AIP unit ID.

A slider SD, which is in contact with a power line LL installed on the conveyer CV, is provided for taking in electric power for the outdoor unit EX. The electric energy is provided to the outdoor unit EX via a switch SWa and three power lines L1, L2, and L3 connected with the tube/wire connector PD. These power lines LL may provide power in different modes (for example, two-phase alternating currents of 100 Volts and 200 Volts and three-phase alternating currents of 100 Volts and 200 Volts). Based on the information on the outdoor unit EX received from the stations ST1–ST6, the controller CCb controls the switch SWa to deliver necessary electric power to the outdoor unit EX through the power lines L1, L2, and L3.

An interface circuit IFa connected with the controller CCb is provided for exchanging data with the associated outdoor unit EX. The interface circuit IFa is connected with the power lines L1 and L2 via a switch SWb so that the controller CCb may exchange information with the outdoor unit EX only when the switch SWb is closed.

The switch SWb is turned on when the controller CCb of an automated unit for variable-capacity type air conditioner, for example. In this case, the outdoor unit EX is equipped with a microcomputer to control the controller CCb. On the other hand, when the outdoor unit EX is one whose compressor MP is turned on and off, the switch SWb is switched off.

Figure 6:
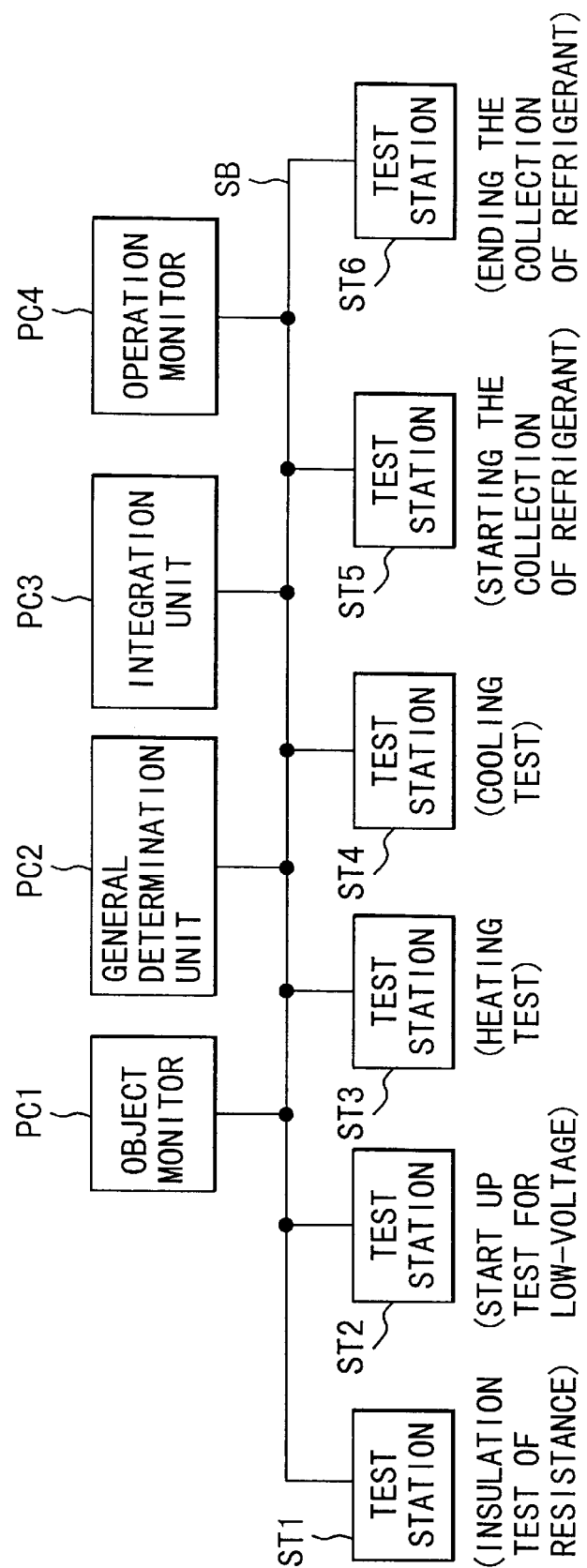
FIG. 6 is a block diagram representation of a data processing system of the test system.

Referring to FIG. 6, there is shown a control system of the test system. It is shown in the figure that a bus SB is provided to connect not only the stations ST1–ST6, but also an object monitor PC1, a general determination unit PC2, an integration unit PC3, and an operation monitor PC4 together, so that necessary data may be exchanged between them through the bus SB.

The integration unit PC3 may control the operations of the test and the post-test stations ST1–ST6, the object monitor PC1, and the general determination unit PC2 in an integrated manner. The integration unit PC3 is also capable of storing a given number of the results of the tests in a historical order for each type of the outdoor units EX.

The integration unit PC3 includes a common memory which is accessible to any of the stations ST1–ST6 and the devices such as the object monitor PC1, the general determination unit PC2, the integration unit PC3 and the operation monitor PC4, since they are connected with the bus SB. Through the common memory it is possible to organize the operations of the above mentioned stations and the devices and control the operation of the individual stations and the devices.

The operation monitor PC4 may serve as an I/O device for inputting various types of information for the test system and for storing the information in the common memory, so that the monitor PC4 is preferably installed in a product quality control room, for example, where a manager may easily access the stored information for controlling the stations ST1–ST6, the object monitor PC1 and the general determination unit PC2.

Referring now to FIG. 7, there is shown a basic structure of the test station ST1. However, it should be understood that the test stations ST1–ST4 are of the same structure, so that what is described below on the test station ST1 in connection with FIG. 7 is true for other test stations ST2–ST4, and description for them will not be repeated. The test station ST1 is under the control of a controller CCc. A limit switch LSa may detect the cart CD when the cart has arrived at the test position associated with the test station. A wireless communication system WRb may exchange data necessary for the station ST1 with the wireless communication system WRa of the control unit CC of the cart CD. A wireless communication system IOb may exchange various data with the wireless communication system IOa of the AIP unit ID as required.

Referring to FIG. 8, there is shown an exemplary post-test station that may be used as any one of the stations ST5 and ST6. A controller CCd controls the post-test station. A limit switch LSb detects the cart CD arriving at the test site of the post-test station. A wireless communication system WRc may exchange various data with the wireless communication system WRa of the control unit CC of the cart CD. A wireless communication system IOc is provided for exchanging data with the wireless communication system IOa of the AIP unit ID. A machine RB for collecting refrigerant may recover, from the dummy indoor unit to the outdoor unit EX, the refrigerant that has flown out of the outdoor unit EX into the dummy indoor unit.

Referring to FIG. 9, there is shown a sequence of steps performed by the controllers CCc and CCd during the tests and post-test operations in the stations ST1–ST6.

When a cart CD is detected by the limit switches LSa and LSb (Step 101), the controller retrieves from the AIP unit ID information regarding the type of test (referred to as test type information) or post-test operation that will be performed in the associated station ST1–ST6 (Step 102).

Next, various control data required for a particular type of test, for example, a procedure to start up the air conditioner in accord with that type of the test, are retrieved from the integration unit PC3. The control data are given to the control unit CC of the cart CD (Step 103).

Given the control data, the control unit CC actuates the outdoor unit EX such that the station ST1–ST6 performs required tests or post-test operations, and obtains corresponding results (Step 104).

The station ST1–ST6 then writes the results of the test or post-test operations in the AIP unit ID (Step 105), and at the same time transmits the results to the general determination unit PC2 along with other data such as the identification code of the outdoor unit EX tested.

It should be noted that in the example herein shown, the invention determines the heating capacity of the outdoor unit EX from the evaluation of data obtained in sequential measurements of the electric current and the refrigerant pressure at the low-pressure end of the compressor MP during a transient period which begins at a time after the start up of the heating mode, while the refrigeration capacity of the outdoor unit EX is determined from the evaluation of data obtained in sequential measurements of the electric current and the refrigerant pressure during another transient period which begins at another time after the start up of the refrigeration cycle.

The principles lying behind the determinations of the heating/refrigeration capacity based on the transient behaviors of the outdoor unit EX will now be described in detail.

Figure 10:
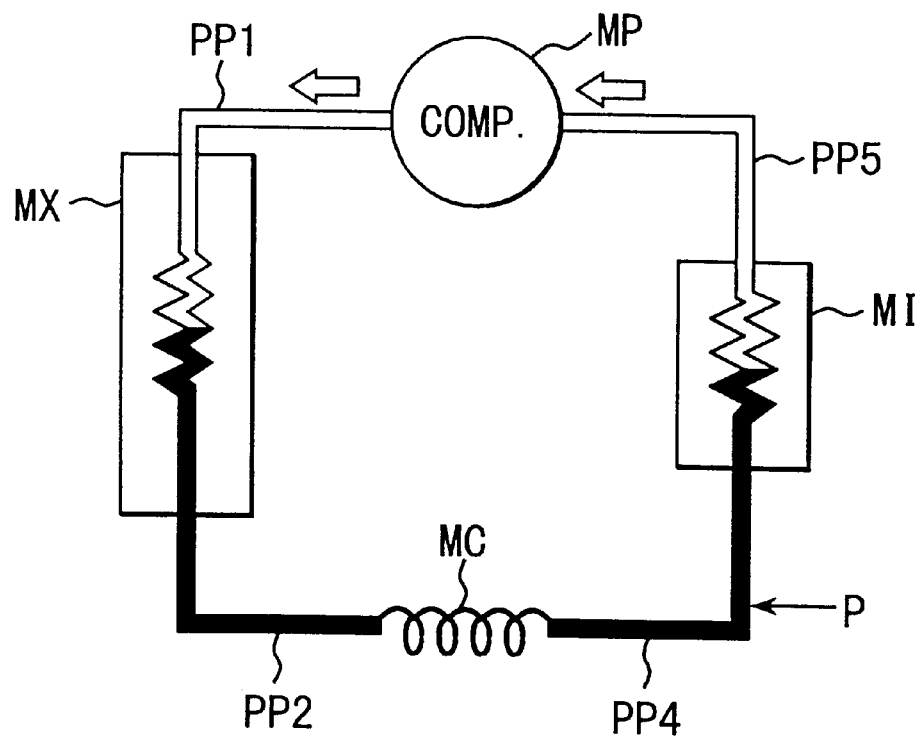
FIG. 10 is a block diagram showing the basic structure of a refrigeration unit with its outdoor unit connected with a dummy indoor unit and operating in a cooling mode.

FIG. 10 depicts the basic structure of an air conditioner comprising the outdoor unit EX connected with a dummy indoor unit DM, operating in a cooling mode.

A gaseous refrigerant, compressed in the compressor MP to a state of high pressure and high temperature, is liberated from the outlet of the compressor MP to the outdoor heat exchanger MX through a pipes PP1. As the gaseous refrigerant passes through the heat exchanger MX, it is cooled by a fan MM (FIG. 2) and condenses to liquid.

The liquefied refrigerant is passed into a capillary tube MC through a pipe PP2, and then to an indoor heat exchanger MI through another pipe PP4. In the heat exchanger MI, the refrigerant is allowed to evaporate by absorbing heat from the surroundings. The evaporated gaseous refrigerant is returned to the low- pressure end of the compressor MP through a pipe 5, where it is compressed again in the next cycle.

Figure 11:
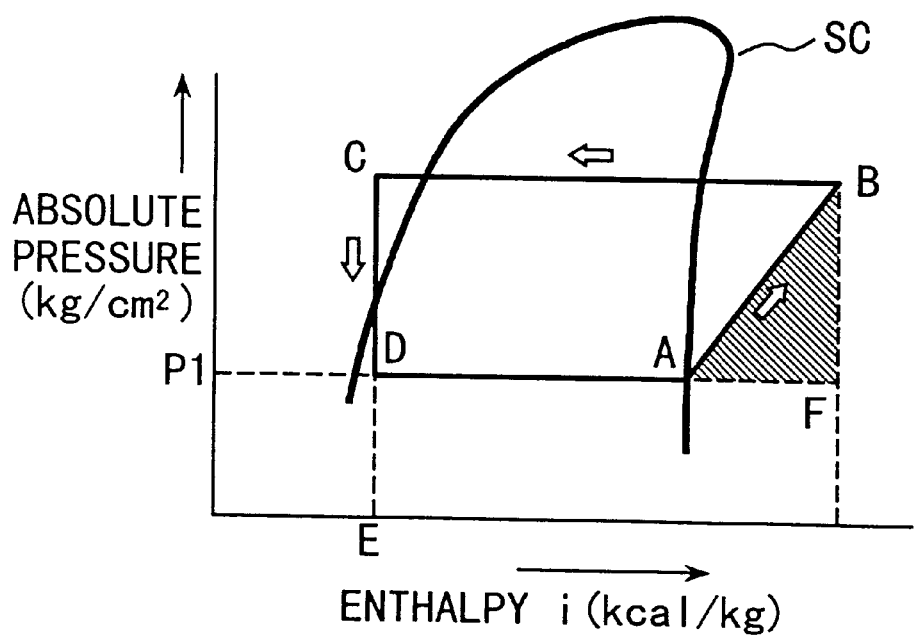
FIG. 11 is a Mollier diagram of the outdoor unit which is connected with the dummy indoor unit in the cooling mode.

FIG. 11 show a Mollier diagram for the refrigeration cycle described above. A curve SC represents the saturation curve for the refrigerant. The curve is obtained by plotting the absolute pressure of the refrigerant gas as a function of enthalpy.

If in a refrigerant cycle the unit is operating in a normal operating condition, the refrigerant undergoes changes in state starting from a point A through points B, C and D, and back to the point A on the Mollier diagram. The side AF of a shaded triangular region as defined by the three points A, B, and F, represents the work-equivalent of heat or the amount of heat equivalent to the net work done by the compressor MP, from which the refrigeration cycle may be determined.

The Mollier diagram does not change for the refrigeration cycle so long as the lower pressure P1(pressure at point D) and the work-equivalent AF of the compressor MP remains unchanged. In other words, should any abnormalitiy takes place in the refrigeration cycle, at least one of the pressure P1 and the work-equivalent AF is changed.

For example, if the output pressure of the compressor MP is lowered due to some malfunction of the compressor, point B will move downward towards point A along the line BA, resulting in a change in length of the side AF. If the capillary tube MC is clogged, the lower pressure P1 will decrease.

It should be understood that the work-equivalent of the compressor MP, that is the length of the side AF, is proportional to the amount of energy consumed by the compressor MP, and that under a given voltage supplied to the compressor the energy consumption is proportional to the electric current that flows through compressor. Thus, it is possible to determine if there is any malfunction with the compressor by measuring the lower pressure P1 at point D and the electric current during a refrigeration cycle.

Noting such characteristic behaviors of the refrigeration cycle as described above, we have found from repeated experiments that there are notable correlations between the types of malfunction and the capacity of a refrigeration cycle in terms of the refrigerant pressure at the low-pressure end of the compressor and the electric power consumed therein, as shown in FIG. 12. In this figure, "Rise" and "Fall" mean rise and fall in electric current through the compressor or in refrigerant pressure at the low-pressure end of the compressor. It should be noted, however, that the "Rise" and "Fall" of the pressure can be easily overlooked, especially when the change in pressure is "a little rise", if the pressure has a rising and falling trend, respectively, since the rising and falling trend can easily smear small characteristic changes. The same is true for the electric current. In FIG. 12, such indiscernible changes are referred to as "NG" (as described in detail later). In order to discern these characteristic changes from the trend without failure, simultaneous measurements of the pressure and the electric current as well as trend tests thereof are inevitable, as described in detail below. Such simultaneous measurements are recommended also for most commonly observed symptoms of type "1" and type "2" as shown in FIG. 12.

Similarly, it is possible to diagnose the heating capacity of an outdoor unit EX by measuring the lower pressure in the refrigeration cycle of the compressor and the electric current through it during a heating cycle.

It is well known that the electric current through a compressor and the refrigerant pressure at the low-pressure end of the compressor of the outdoor unit is greatly affected by the ambient factors such as atmospheric pressure, and room temperature during a test, and also by the duration of operation. This is because the temperature and the humidity in the testing room are affected by the outdoor temperature and humidity and other climatic conditions. Therefore, a single test criterion cannot be applied to the capacity tests under these variable ambient conditions. Hence, the invention employs a new test procedure, as described in detail below.

Figure 13:
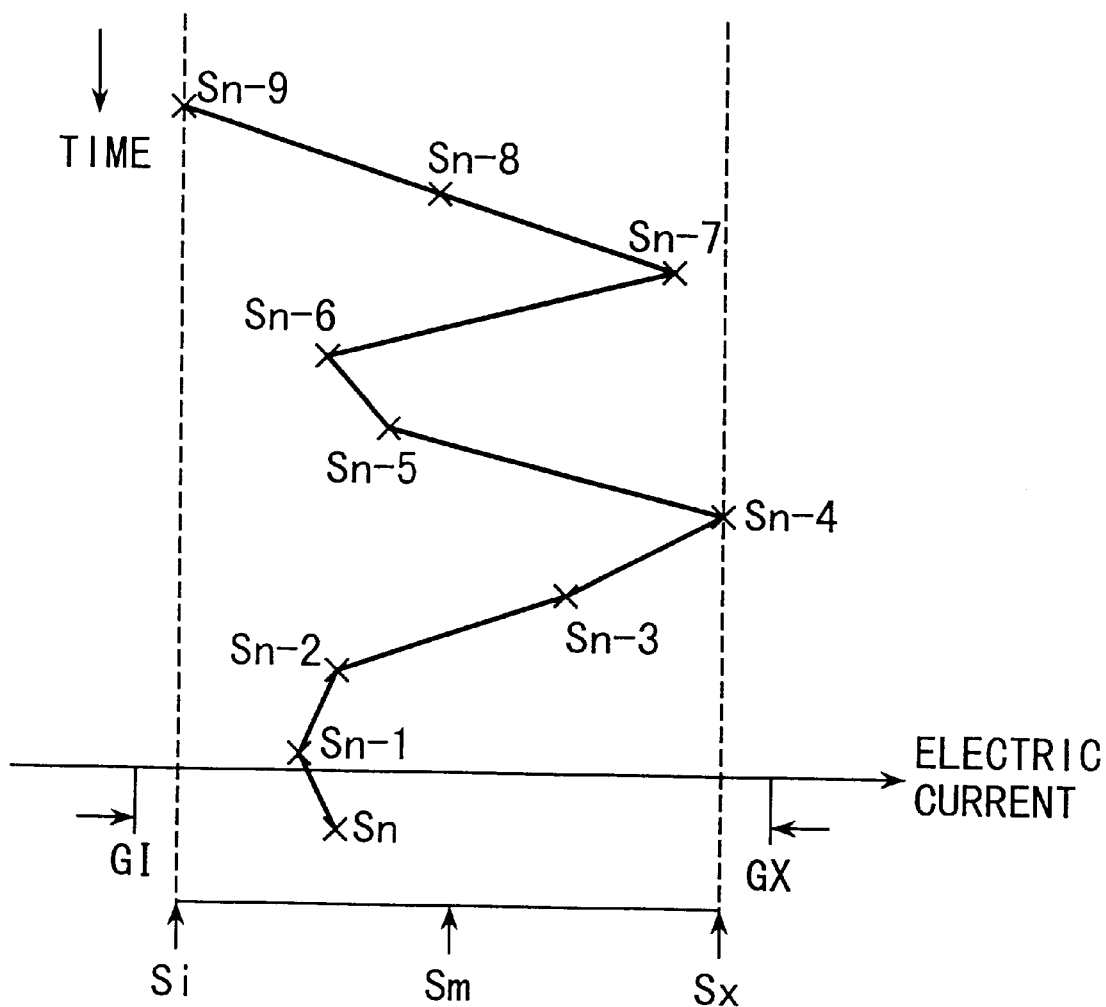
FIG. 13 is a graphical representation of a sequence of electric currents obtained in consecutive measurements over a given period of time.

Referring to FIG. 13, a general procedure for evaluating a set of values obtained by a sequence of measurements. FIG. 13 shows such an example of measured values (which will be referred to as reference data) obtained in consecutive measurements of a physical quantity such as electric current through a compressor MP, over a period of time. The following description of such measurements mainly concerns the electric current, but it would be understood by persons skilled in the art that it will apply equally well to the lower pressure in the refrigeration cycle of the compressor.

The value of the electric current to be evaluated in the capacity test is referred to as current value and denoted by Sn. Sample values that precedes Sn are denoted by S(n−1), S(n−2), - - - , S(n−9) in the order of reverse time.

From these measurements it is possible to set an upper and a lower limits GX and GI, respectively, of a region (referred to as trend test reference range) for testing the validity of the current value Sn, as described below. If the current value Sn falls within the trend test reference range, Sn is determined to be proper. Otherwise, it is determined to be improper. Such determination of the validity of the current value based on the reference data that precede Sn will be referred to as trend test. The trend test reference range may be defined such that it is centered at the mean value, Sm=(Sx+Si)/2, of the minimum Si and the maximum Sx of the preceding values S(n−1) through S(n−9), and has a width which is equal to the difference, (Sx−Si) multiplied by a factor K1.

Thus, the upper limit GX may be defined by (Sx+Si)/2 plus (Sx−Si)/2 multiplied by K1, and the lower limit GI by (Sx+Si)/2 minus (Sx−Si)/2 multiplied by K1.

A test reference range for the variation of S(n) in reference to the preceding reference data S(n−1) may be also defined by multiplying by a factor K2 the maximum of the variations between the two successive reference data S(n−1) through S(n−9).

Thus, the current data Sn may be tested two-fold by seeing if the data falls within the first reference range and if the variation falls within the second reference range. The test based on the second reference range will be referred to as trend test.

The trend test may provide an adequate evaluation of a time dependent variation of a physical quantity. From the trend tests for the electric current and the refrigerant pressure, the capacity of an outdoor unit EX may be determined quite well.

Actual evaluation of measurement data follows the above general procedure.

Figure 14:
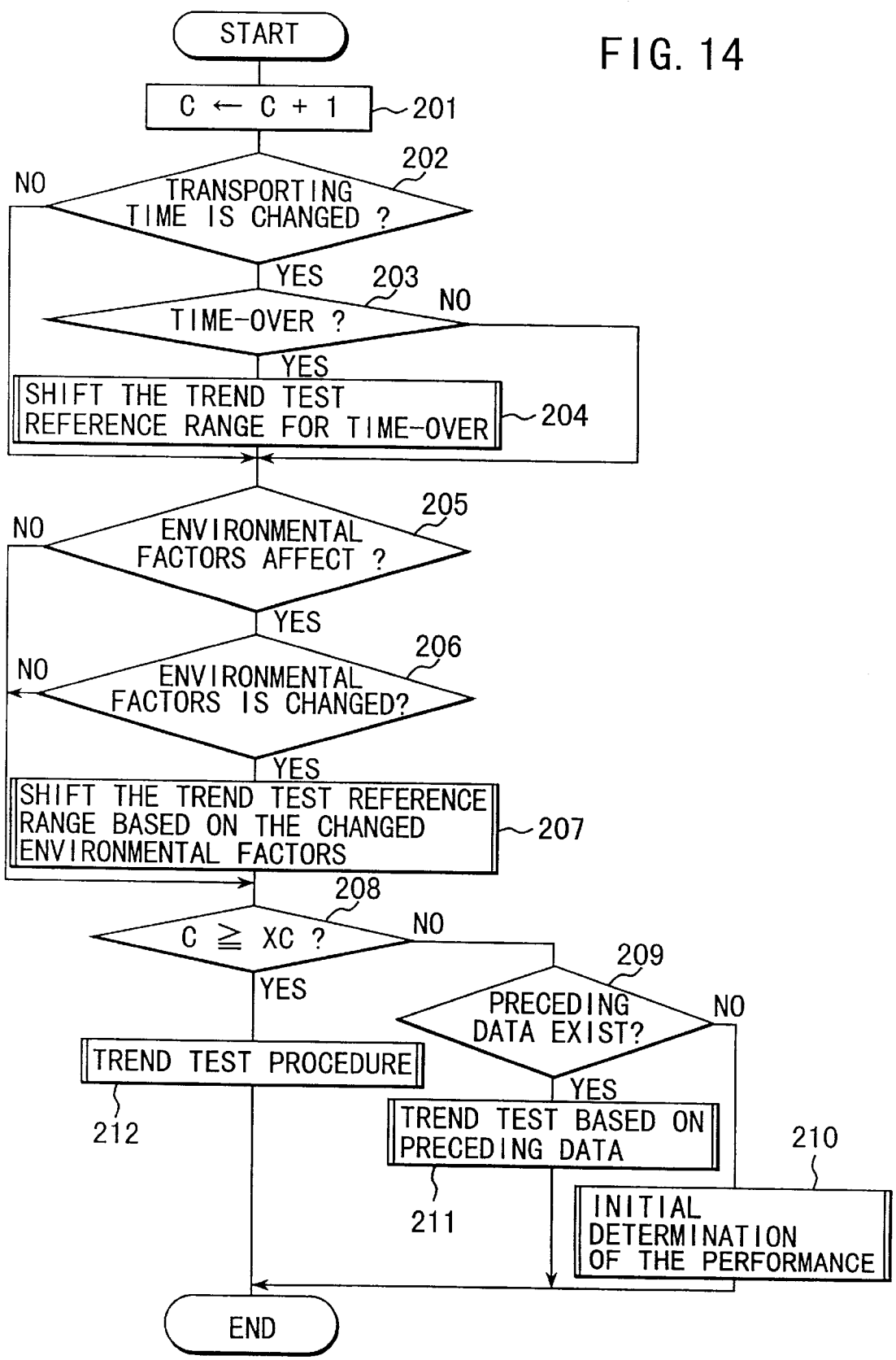
FIG. 14 is a flowchart illustrating a data processing procedure in the capacity test.

FIG. 14 shows a procedure taken by the general determination unit PC2 for processing the measured data in the tests.

At the beginning, a counter C is initialized to zero every time the model or type of the compressor under test is changed. The counter is incremented by 1 every time a test is repeated for the outdoor units of the same model (Step 201). Thus, the count stored in the counter represents the number of the tests repeated.

In Step 202, a query is made if the trend test reference range must be modified for the outdoor unit under test. This is because measured values often depend on the length of the period of operation prior to the measurement. Normally, the conveyer carrying the outdoor unit ES is driven at a constant speed and hence the length of simulation mode that the outdoor unit EX has experienced while it is carried by the conveyer (which equals transport time between the two test stations) is substantially constant. However, the conveyer sometimes speeds up or slows down due to accidental causes in one test station or another in the assembly line, thereby varying the period of operation of the outdoor unit before the measurement. Thus, in order to perform a proper trend test, the modification of the trend test reference range is necessary in accordance with the nature of the measurable physical quantity and the length of operation, as is done in Step 202.

If the answer is YES in the query 202, a further query is made if the period of heating or cooling between two successive test stations is preset transport time T1 (Step 203), where T1 is set to twice the period required for the outdoor unit to move from one station to another, for example from the test station ST2 to the test station ST3, under a normal operating condition.

If the answer is YES in the Step 203, an offset value OFt is calculated in Step 204. The offset value OFt represents the magnitude that the trend test reference range (described in detail later) must be shifted to compensate excessive heating or cooling that has taken place in connection with the Step 203. The magnitude of the offset OFt is determined based on empirical data established for that type of outdoor unit EX under test. On the other hand, if the answer is NO in either the Step 202 or 203, it means that the physical quantity is not affected by the transport time, and the Step 204 is skipped. The offset value OFt is then set to zero.

Next, a query is made if the trend test reference ranges are affected by the environmental factors (Step 205). If the answer is YES, a decision is made if the environmental factors listed below have changed (Step 206). In the example shown herein, the decision made in Step 206 concerns if at least one of the three parameters has changed: (a) the compressor temperature exceeds the preceding temperature in excess of a predetermined value; (b) the temperature of a dry thermometer in the test station exceeds a predetermined value; and (c) the humidity in the test station exceeds a predetermined value.

When the answer is YES in the Step 206, a step of environmental factor modification (Step 207) is initiated to re-calculate factors Ka and Kp which are used in the trend tests as described in detail later. If, on the other hand, the answer is NO in the Step 206, the Step 207 is skipped. In this case the factors Ka and Kp are set to 1.

Next, the value of the counter C is checked whether it is greater than a predetermined value, which is normally 9 (Step 208). The value of the counter C is initialized to zero at the beginning of a working day or when the type of refrigeration unit changes during the working day. If, in the Step 208, the answer is No for the outdoor unit under test, a query is made if the tests have been done for the same type of the outdoor units at the test station and the test results have been stored in the integration unit PC3 (Step 209). If the answer is NO, an initial value for the test reference range is obtained from the integration unit PC3 for that particular model of the outdoor unit EX, and initial determination of the capacity is made (Step 210).

If the answer is YES in the Step 209, a trend test is made (Step 211) using the trend test reference range obtained from the preceding test results and stored in the integration unit PC3, in a manner as described in detail below.

Coming back to the Step 208, if the answer is YES, a trend test is made (Step 208) using the reference data mentioned previously in connection with FIG. 13.

Figure 15:
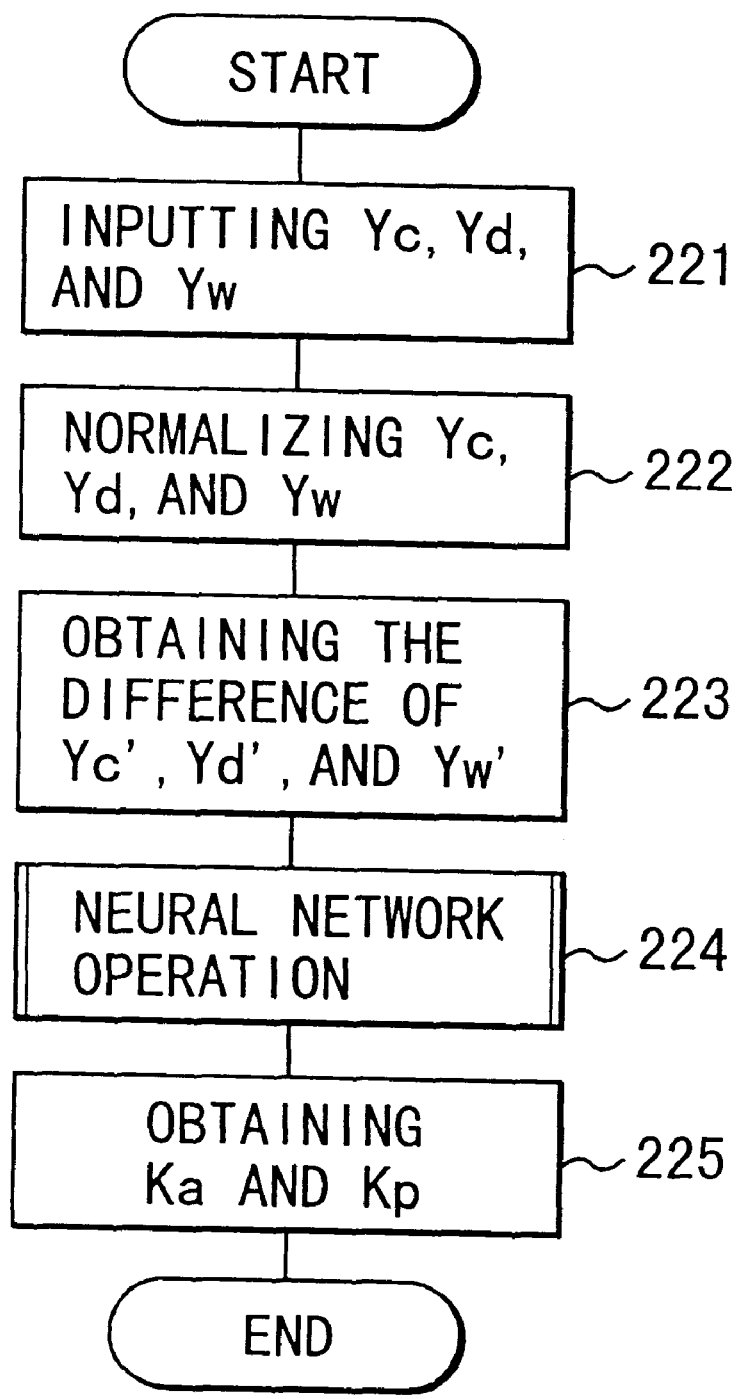
FIG. 15 is a flowchart illustrating a reference shifting procedure for compensating changes in environmental factors.

An example of Environmental Reference Modification step (Step 207) is shown in FIG. 15. The procedure starts with Step 221 where the temperature Yc of the compressor of the current outdoor unit EX, dry thermometer reading Yd, and wet thermometer reading Yw are input. The values of Yc, Yd, and Yw are normalized to Yc', Yd', and Yw', respectively, in Step 222.

In the next Step 223, changes dYc', dYd', and dYw' of the Yc', Yd', and Yw' relative to the preceding values Yc, Yd, and Yw, respectively (hereinafter referred to as difference data) are calculated to obtain the factors Ka and Kp (Step 225) using a prescribed neural network operations (Step 224). The neural network operations are adapted to yield a set of values for the factors Ka and Kp, given a set of changes dYc', dYd', and dYw'. One way to establish the neural network operations is as follows. First a functional relationship is established between a multiplicity of given difference data and the set of factors Ka and Kp. Second, repeat the same step until the functional relationship converges so that one may obtain, for a set of given differences, a desirable set of values for Ka and Kp. This enables the network to yield proper values for the Factors Ka and Kp for an arbitrary set of reference data.

Figure 16:
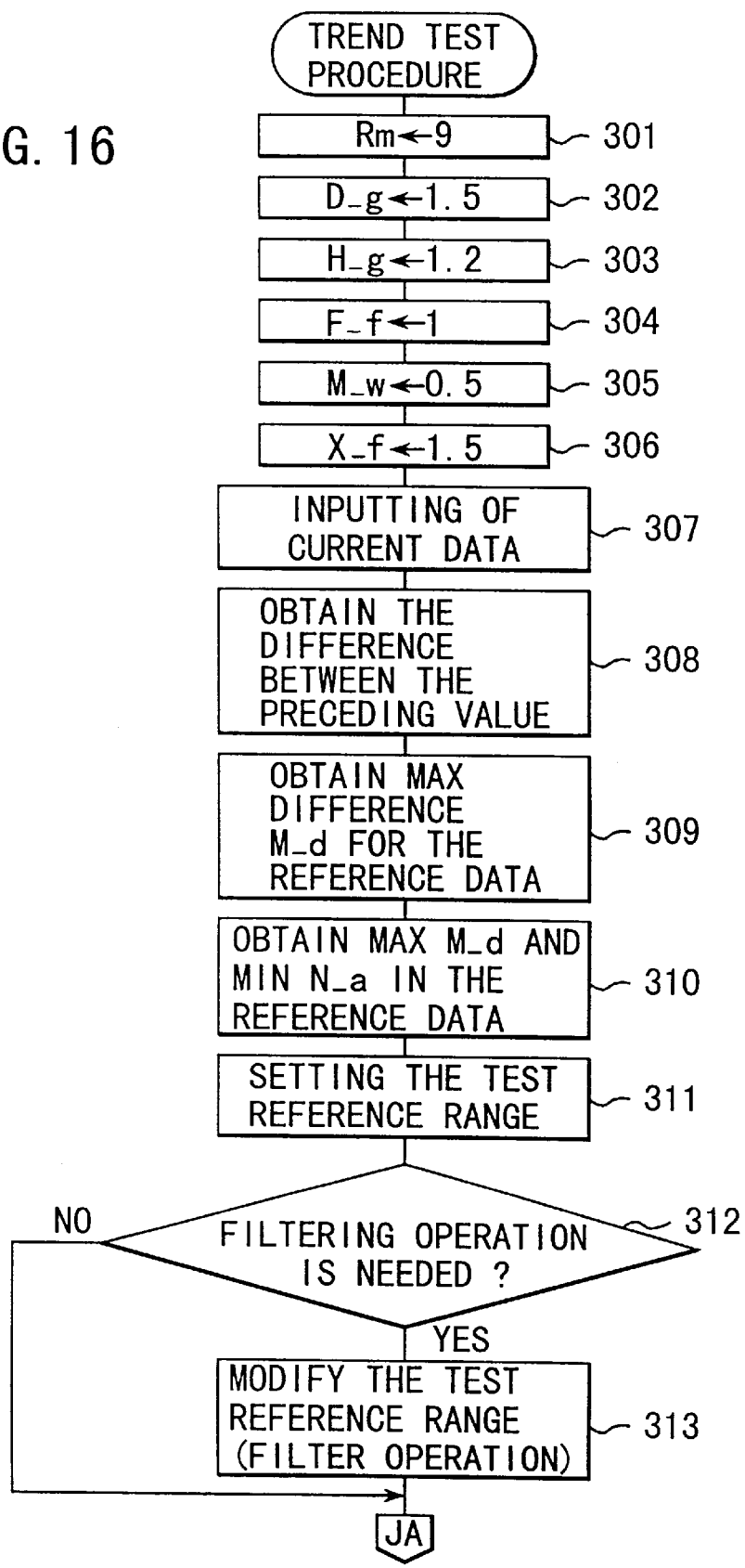
FIGS. 16 and 17 altogether show in flowchart a trend test procedure.
Figure 17:
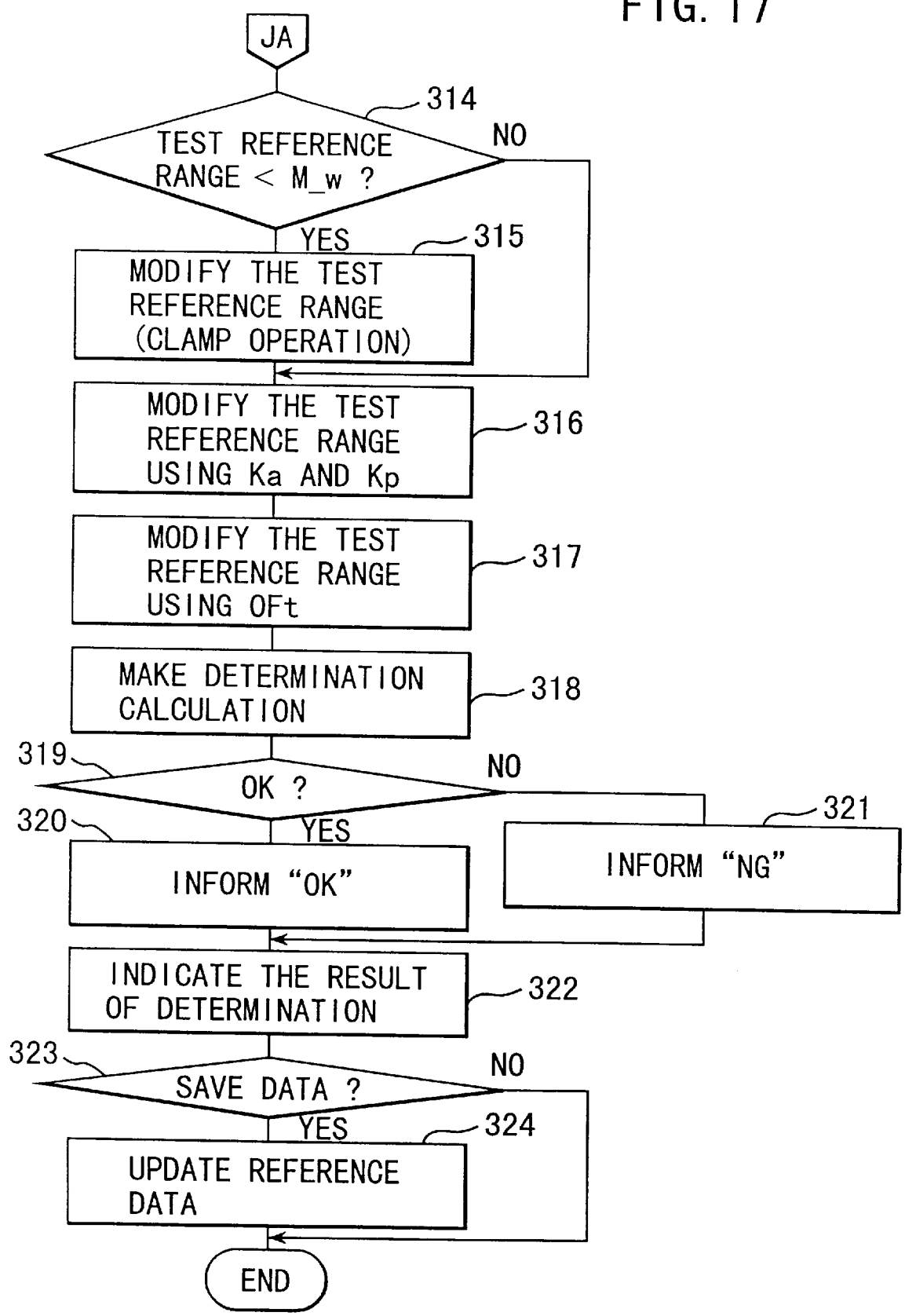

FIGS. 16 and 17 altogether show a procedure for the trend test of the Step 212. As seen in the figures, the procedure starts with Step 301 where a number Rm, indicative of the number of reference data used in constructing a trend reference range, is set to a predetermined number, which is 9 in this example. The procedure then proceeds to the following steps in sequence: Step 302 where Trend Test Data D_g is set to 1.5; Step 303 where Max/Min Correction Factor H_g associated with the trend test reference range to 1.2 (Step 303); Step 304 where a flag F_f for a predetermined Filter Operation described below is set; Step 305 where Lower Limit Factor M_w, which is a factor to define the lower limit of the reference range for the trend test, is set to 0.5 amperes; and Step 306 where a factor X_f to define the number of data to be included in the reference data, to 1.5.

When all of the initialization steps 301 through 306 are finished in this manner, a current data D, which corresponds to Sn, is input in Step 307, so that a difference dD between the current data D and the preceding data S(n−1) may be calculated and stored in a memory (Step 308).

Next, the maximum variation is obtained for the reference data (Step 309) by calculating the difference between two successive data, along with the maximum and the minimum of these measurements (Step 310). From the results of these calculations, Lower Limit D_mi and Upper Limit D_max of the trend test reference range are obtained using the following set of equations (i).

$$D\_min = (X\_a + N\_a)/2 - ((X\_a - N\_a)/2) \times H\_g$$

$$D\_max = (X\_a + N\_a)/2 + ((X\_a - N\_a)/2) \times H\_g \quad (i)$$

D_min and D_max correspond to GI and GX of FIG. 13, respectively.

In the next Step 312, a decision is made if the flag F_f is set. If the flag is set, the following operation is perform ed to modify the D_min and D_max using the following equations (ii).

$$D\_min = (D\_min + D\_min' \times Cf)/(Cf+1)$$

$$D\_max = (D\_max + D\_max' \times Cf)/(Cf+1) \quad (ii)$$

where D_min' and D_max' are the lower and upper limits of the trend test reference range, respectively, obtained in the preceding calculation. A quantity Cf is an appropriate factor to modify D_min' and D_max' to D_min and D_max, respectively. This modification (ii) is called Filter Operation. A default value of Cf may be arbitrary chosen, which is 2 in this example. It should be noted that, when the flag F_f has not been set (resulting in NO in Step 312), Step 313 is skipped.

In Step 314, a decision is made if the calculated trend test reference range is smaller than the Lower Limit Factor M_w (Step 314). If it is, then the calculated lower and upper limits of the trend test reference range, D_min and D_max, respectively, are clamped or modified such that the width of the trend test reference range becomes a prescribed minimum values (Step 315). However, if the decision is No in Step 314, Step 315 is skipped.

The procedure then proceeds to Step 316, where the minimum and the maximum, D_min and D_max, respectively, are multiplied by respective factors, Ka and Kp, and to the next Step 317 where the lower and the upper limits, D_min and D_max, respectively, are further modified by addition of offset value OFt to each of them, and further to Step 318 where the following set of inequalities is applied to the current test data.

$$dD > M d \times D\_g$$

and $$C\_min > D \text{ or } C\_max < D \quad (iii)$$

A decision is made in Step 319 to see whether the above inequalities is TRUE or FALSE. If the result is TRUE, implying that the current data is proper and that the outdoor unit EX passed the test, an OK sign is passed to the integration unit PC3 (Step 320). But if the decision made in Step 319 is NO, implying that the current data is improper or "NO GOOD", an NG (NO GOOD) sign is passed to the integration unit PC3 (Step 321) and to the operator OP2 (Step 322).

In the next Step 323, a decision is made whether the current data D is to be saved so that it is incorporated in the reference data to update the test reference ranges for the next test. The data D is saved if it falls in the trend test reference range, that is, between the lower and the upper limits, D_min and D_max, respectively, multiplied by a factor X_f. The reason why the current data D is used in updating the reference data is to incorporate the varying nature of the measurable physical quantity in the tests.

If the decision is YES in Step 323, the reference data is updated in Step 324, which completes the procedure. If the decision is NO in the Step 323, the Step 324 is skipped.

The foregoing procedure is applied to the electric current and the refrigerant pressure during the heating mode and to the cooling mode of the outdoor unit EX. From these results, the capacity of the outdoor units may be determined, with reference to the diagnostic table shown in FIG. 12.

It should be appreciated that in the example shown herein the current data D is evaluated properly if environmental factors have changed.

Figure 18:
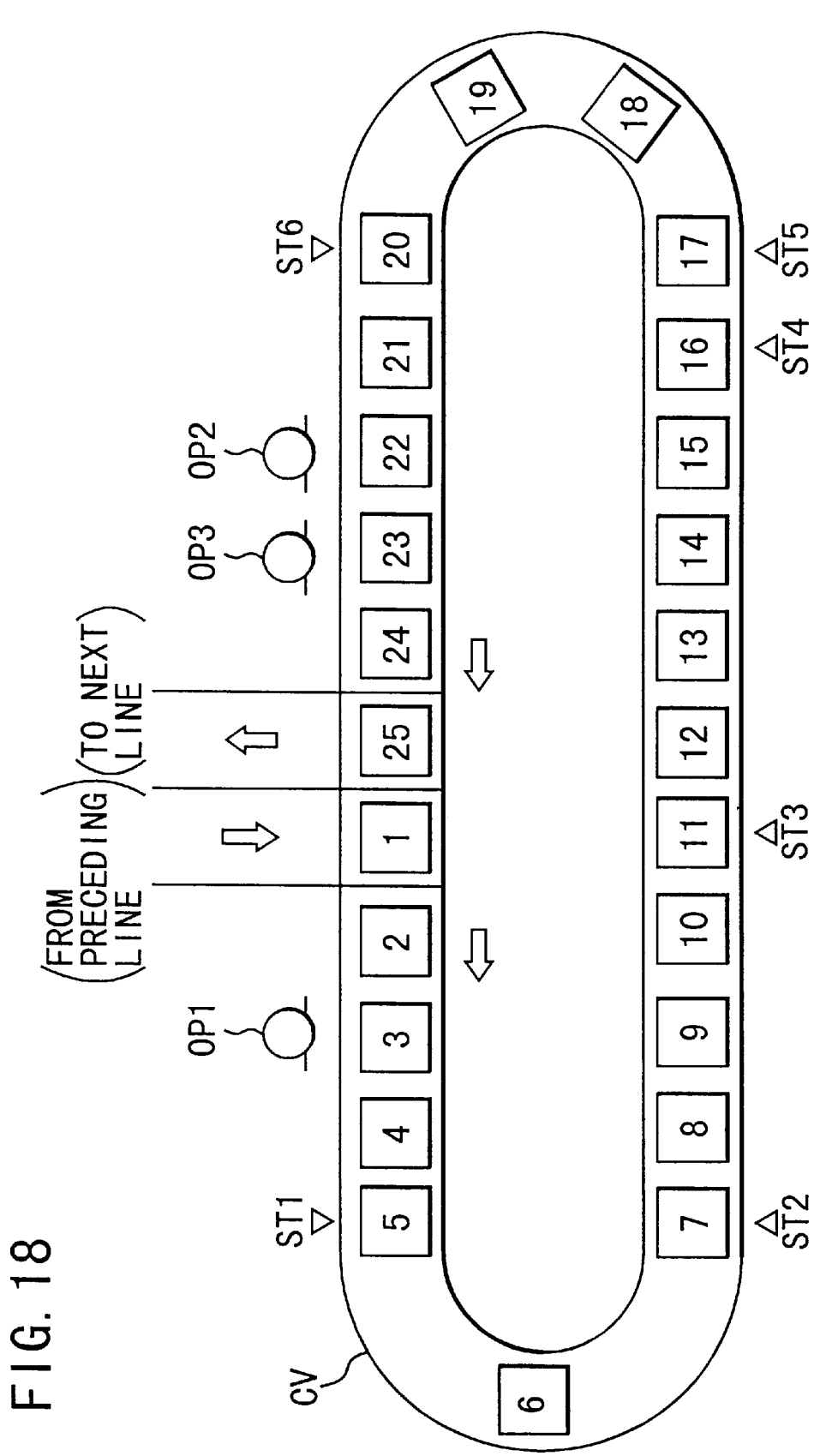
FIG. 18 is a schematic view of the quality test line immediately after the test line is put in a stopping operation.

When the assembly line is stopped for some reason, e.g. for lunch time recess, the test line will be stopped, not instantly but only after a stopping operation has taken place to prevent a sudden interruption of the tests currently conducted. FIG. 18 illustrates a test line immediately after the test line was instructed to stop its operation, and has entered such stopping operation. This stopping operation is initiated manually by an operator by pushing the stop button on the control panel. When the stopping operation is initiated, the test line is disconnected from the assembly line with which the test line has been connected for the tests. (The test line is connected with the assembly line at the time of its start up.) As a result, the conveyer CV of the test line circulates by itself in the form of endless conveyer.

Under such circumstances, the operators OP1, OP2, and OP3 would have walked away from their positions, so that there will be some outdoor units EX on the carts (such as carts "1", "2", and "3" shown in FIG. 18) not connected at all or only partially with the respective tube/wire connectors PDs.

In the example shown herein, the following step is taken for automatically circulating the carts on the endless conveyer, subsequent to the initiation of the stopping operation.

In the circulation step, the outdoor units not connected with the tube/wire connectors PDs will not be tested, and after a complete rotation of the conveyor subsequent to the stopping operation, they come back to their original positions; outdoor units that have been already tested will be exempt from the tests; integral determination for the unit that has finished the tests is done manually by an operator only after the line has resumed its operation; and outdoor units that have passed the tests are individually directed by an operator to the next assembly line.

Figure 19:
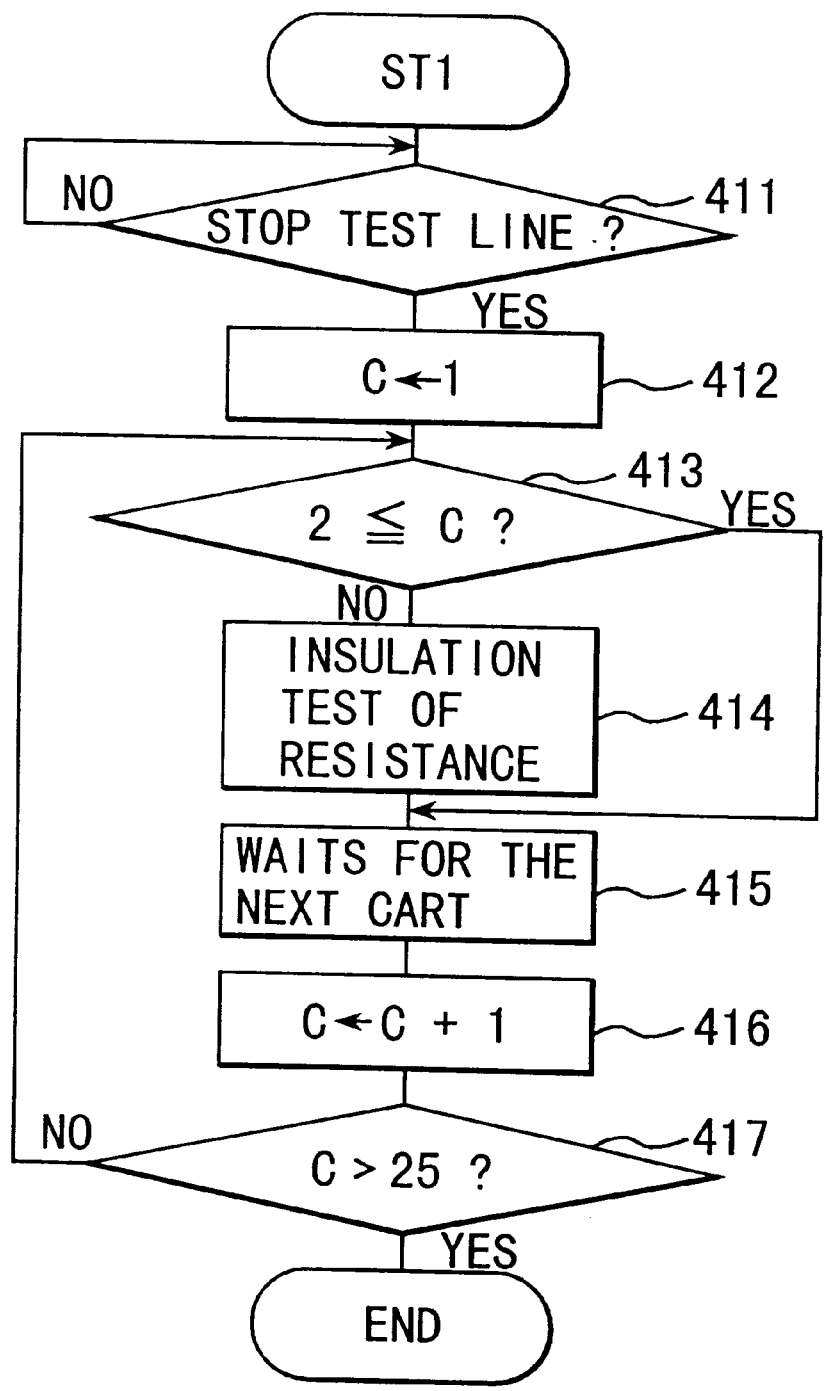
FIG. 19 is a flowchart showing the steps carried out in the test station ST1 immediately after the test line is put in the stopping operation.

FIG. 19 shows a procedure carried out in the test station ST1 in the stopping operation. Suppose now that the outdoor units on the carts 4 and 5 had been connected with the respective indoor units and the unit on the cart 5 had been under test at the test station ST1, as shown in FIG. 18. If the test station ST1 receives a notice from the integration unit PC3 that the test line will be stopped, the notice is detected (resulting in a decision YES in Step 411 and initialization of the counter C to 1 in Step 412) only after the test is completed for the current outdoor unit on the cart 5 and the next cart 4 is detected. When the counter C is queried if the counter value is equal to or greater than 2 in Step 413, the answer is presently NO, which implies that the detected outdoor unit 4 has been connected with the indoor unit but not tested yet at the test station ST1. The outdoor unit EX on the cart 4 is then tested in the test station ST1 to see if it has required insulation resistance and pressure (Step 414). On the other hand, if the answer is YES in the Step 413, the Step 414 is skipped. Similarly, the Step 414 is skipped for the carts that follow the cart 4 so long as the answer is YES in Step 413.

After the tests in Step 414, the test station ST1 waits for the next cart to arrive (Step 415). When the test station detects the next cart, it increments the counter C by 1 (Step 416), and queries the counter C if its value is greater than 25 (Step 417). If the answer is NO, the procedure returns to the Step 413 and repeats the same Steps 413–417, until the answer becomes YES in the Step 417, when the procedure is ended.

Figure 20:
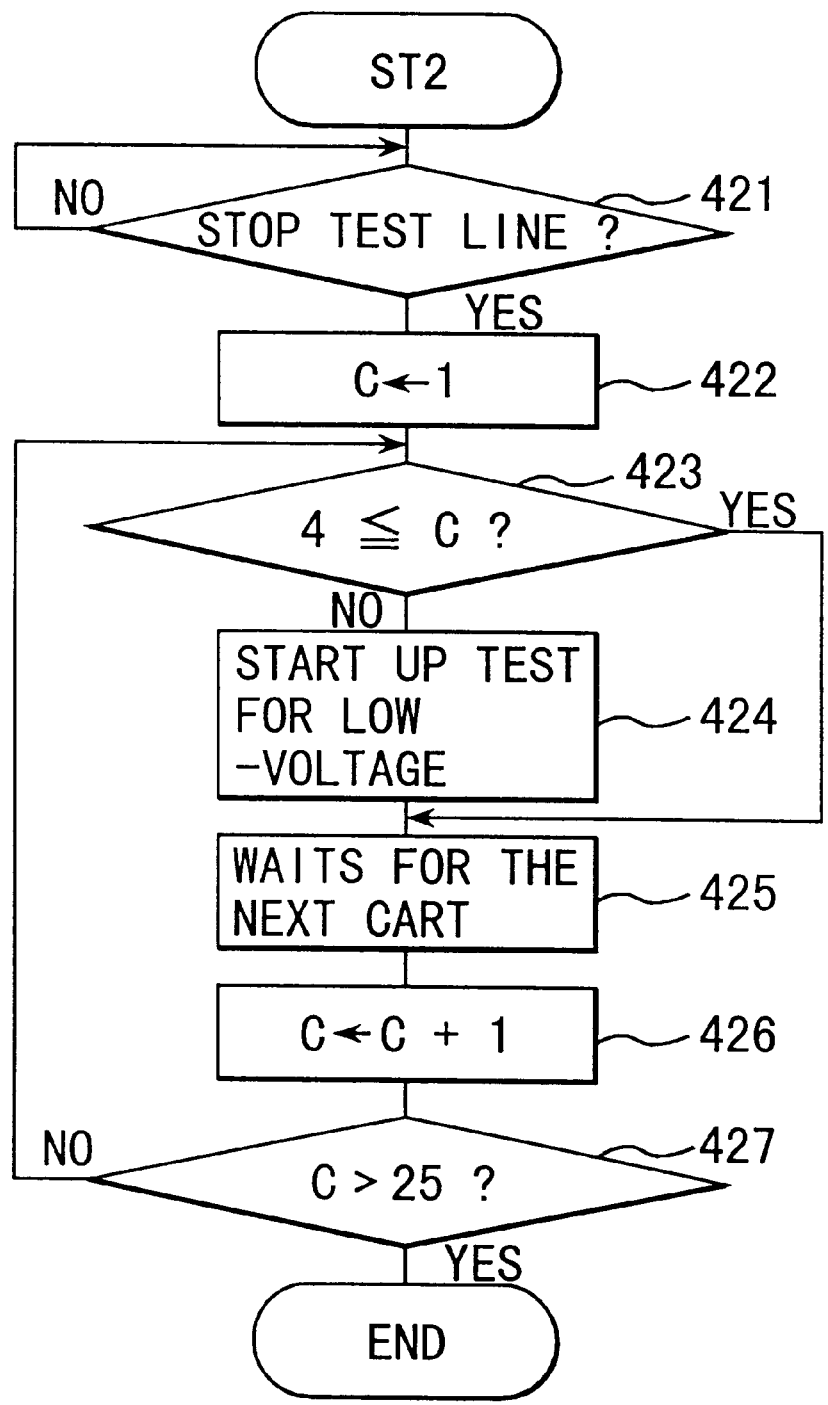
FIG. 20 is a flowchart showing the steps carried out in the test station ST2 immediately after the test line is put in the stopping operation

FIG. 20 shows a procedure carried out in the test station ST2 in the stopping operation. Referring again to FIG. 18, there are four carts "7", "6", "5", and "4" that await the tests in the test station ST2. Of these carts, cart 7 is under test at the beginning of the stopping operation. If the test station ST2 receives the stop instruction from the integration unit PC3, the instruction is detected after the completion of the test for the cart 7 and the cart 6 is detected (resulting in a decision YES in Step 421). The counter C is then initialized to 1 (Step 422). In Step 423, the counter C is queried if the counter value is equal to or greater than 4. If the answer is NO, it implies that the refrigerant tubes and electric wires are connected with the associated indoor unit and that the outdoor unit has not been tested yet at the test station ST2. The outdoor unit EX on the cart is then tested at the test station ST2 to see if the unit may start-up properly at a low-voltage (Step 424). On the other hand, if the answer is YES in the Step 423, the Step 424 is skipped.

The test station ST2 then waits for the next cart to arrive (Step 425). When the test station detects the next cart, it increments the counter C by 1 (Step 426), and queries the counter C if its value is greater than 25 (Step 427). If the answer is NO, the procedure returns to the Step 423 to repeat the same Steps 413–717, until the answer becomes YES in Step 427, when the procedure is ended.

Figure 21:
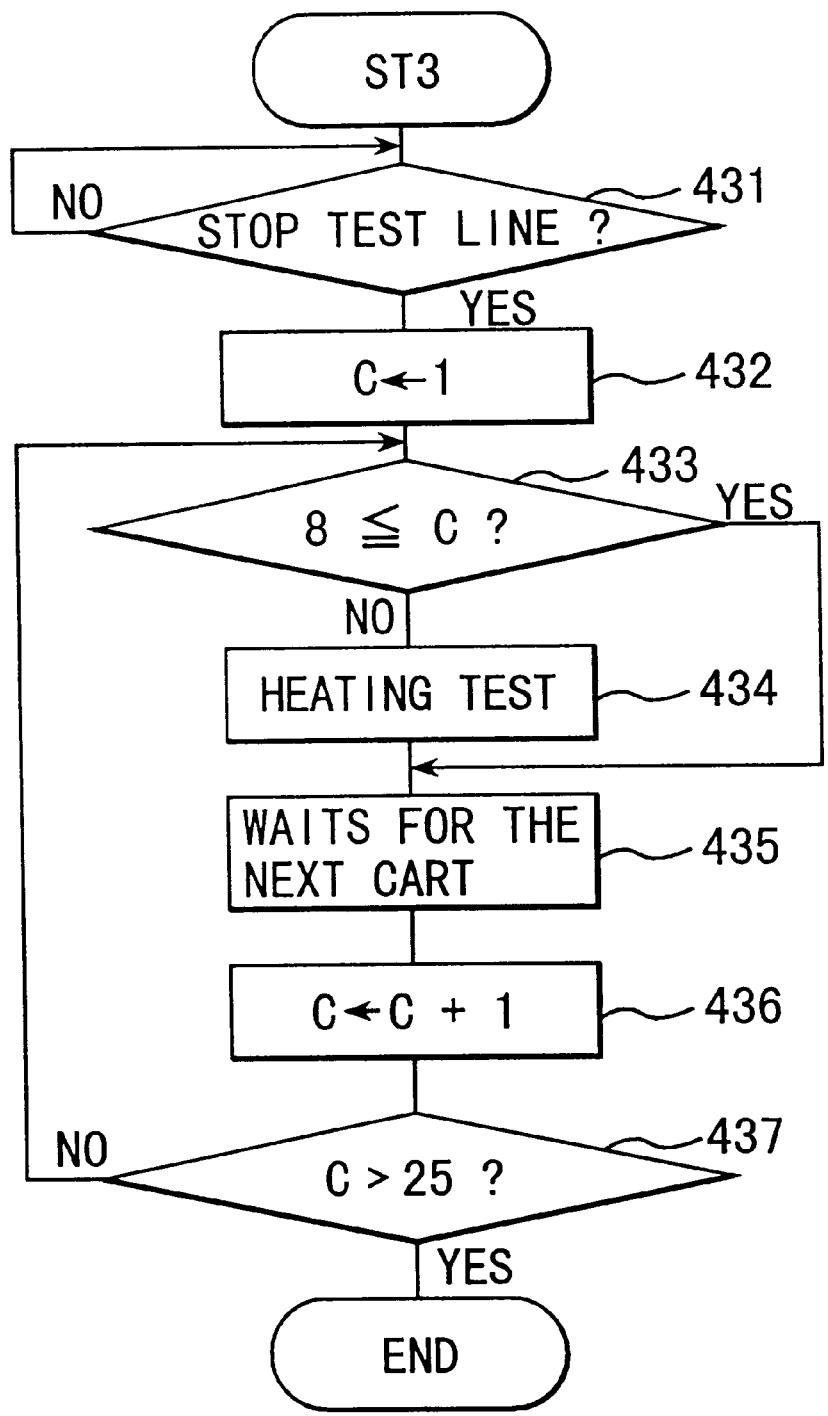
FIG. 21 is a flowchart showing the steps carried out in the test station ST3 immediately after the test line is put in the stopping operation.

FIG. 21 shows a procedure carried out in the test station ST3 in the stopping operation. Referring again to FIG. 18, there are shown seven carts numbered "11" through "4" having outdoor units connected with the respective indoor units and awaiting the tests in the test station ST3. The cart 11 is currently under test. If the test station ST3 receives the stop instruction from the integration unit PC3, the instruction is detected after the completion of the test for the cart 11 and the next cart 10 is detected (resulting in a decision YES in Step 431), and the counter C is initialized to 1 (Step 432). The procedure advances to Step 433, where a query is made if the value of the counter C is equal to or greater than 8. If the answer is NO, it implies that the next outdoor unit has been connected with the associated indoor unit but not tested yet at the test station ST3, so that the outdoor unit EX on the cart is tested to see if it may exhibit a required heating capacity (Step 434). On the other hand, if the answer is YES in the Step 433, the Step 434 is skipped.

The test station ST3 then waits for the next cart to arrive (Step 435). When the test station detects the next cart, the counter C is incremented by 1 (Step 436), and queries the counter C if its value is greater than 25 (Step 437). If the answer is NO, the procedure returns to the Step 433 to repeat the same Steps 433–437 until the answer becomes YES in the Step 437, when the procedure is ended.

Figure 22:
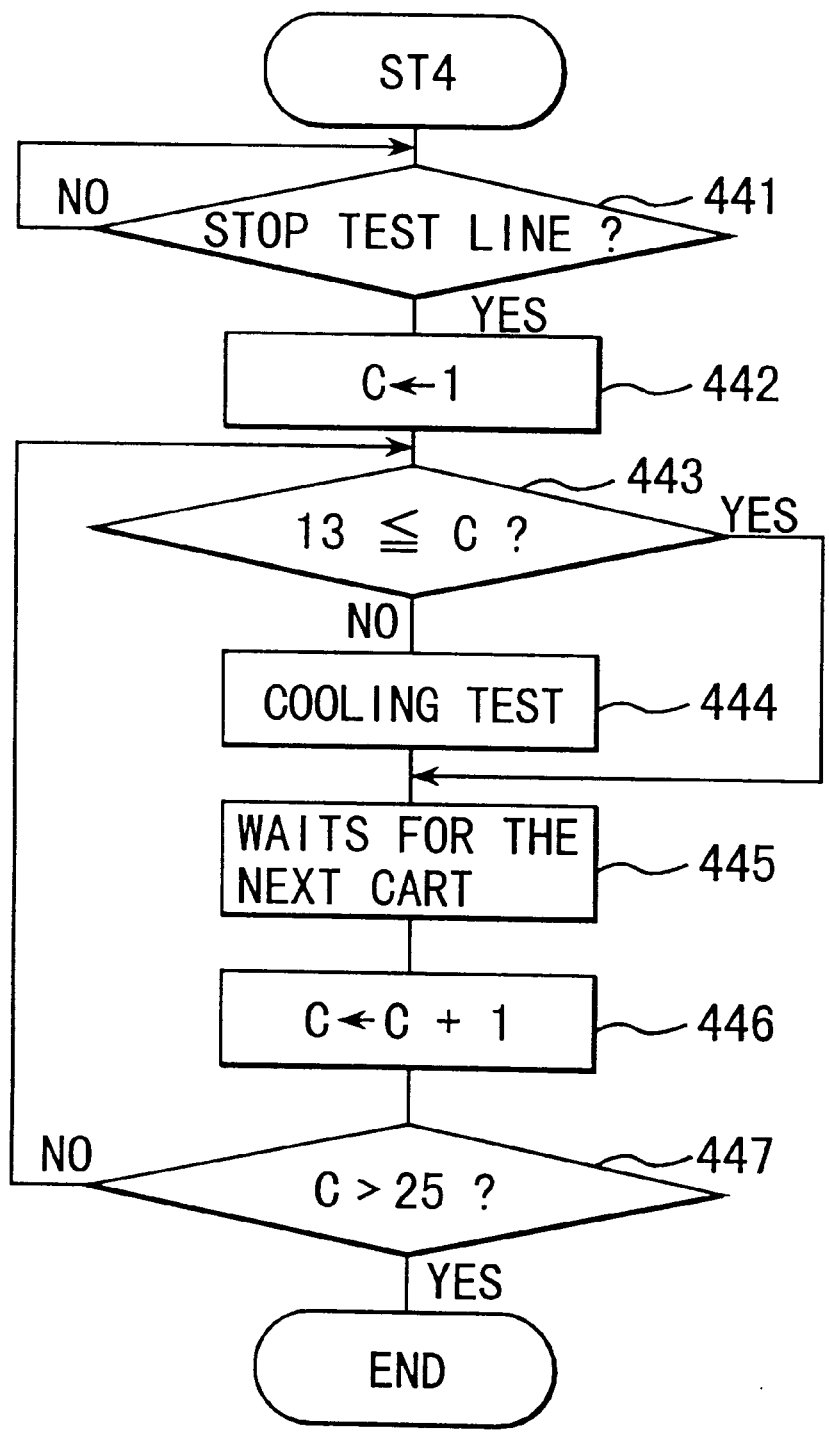
FIG. 22 is a flowchart showing the steps carried out in the test station ST4 immediately after the test line is put in the stopping operation.

FIG. 22 shows a procedure carried out in the test station ST4 in the stopping operation. Referring to FIG. 18, there are shown thirteen carts numbered "16" through "4" having outdoor units connected with the respective indoor units and awaiting the tests in the test station ST4. The cart 16 is currently under test. If the test station ST4 receives the stop instruction from the integration unit PC3, the instruction is detected after the completion of the test for the cart 16 and the next cart 15 is detected (resulting in a decision YES in Step 441), and the counter C is initialized to 1 (Step 442). The procedure advances to Step 443, where a query is made if the value of the counter C is equal to or greater than 13. If the answer is NO, it implies that the outdoor unit EX on the cart 15 has been connected with the associated indoor unit but not tested yet at the test station ST4, so that the outdoor unit EX is tested to see if the unit exhibits required refrigeration capacity (Step 444). On the other hand, if the answer is YES in the Step 443, the Step 444 is skipped.

The test station ST4 then waits for the next cart to arrive (Step 445). When the test station detects the next cart, the counter is incremented C by 1 (Step 446), and queries the counter C if its value is greater than 25 (Step 447). If the answer is NO, the procedure returns to the Step 443 to repeat the same flow of steps until the answer becomes YES in the Step 447, when the procedure is ended.

Figure 23:
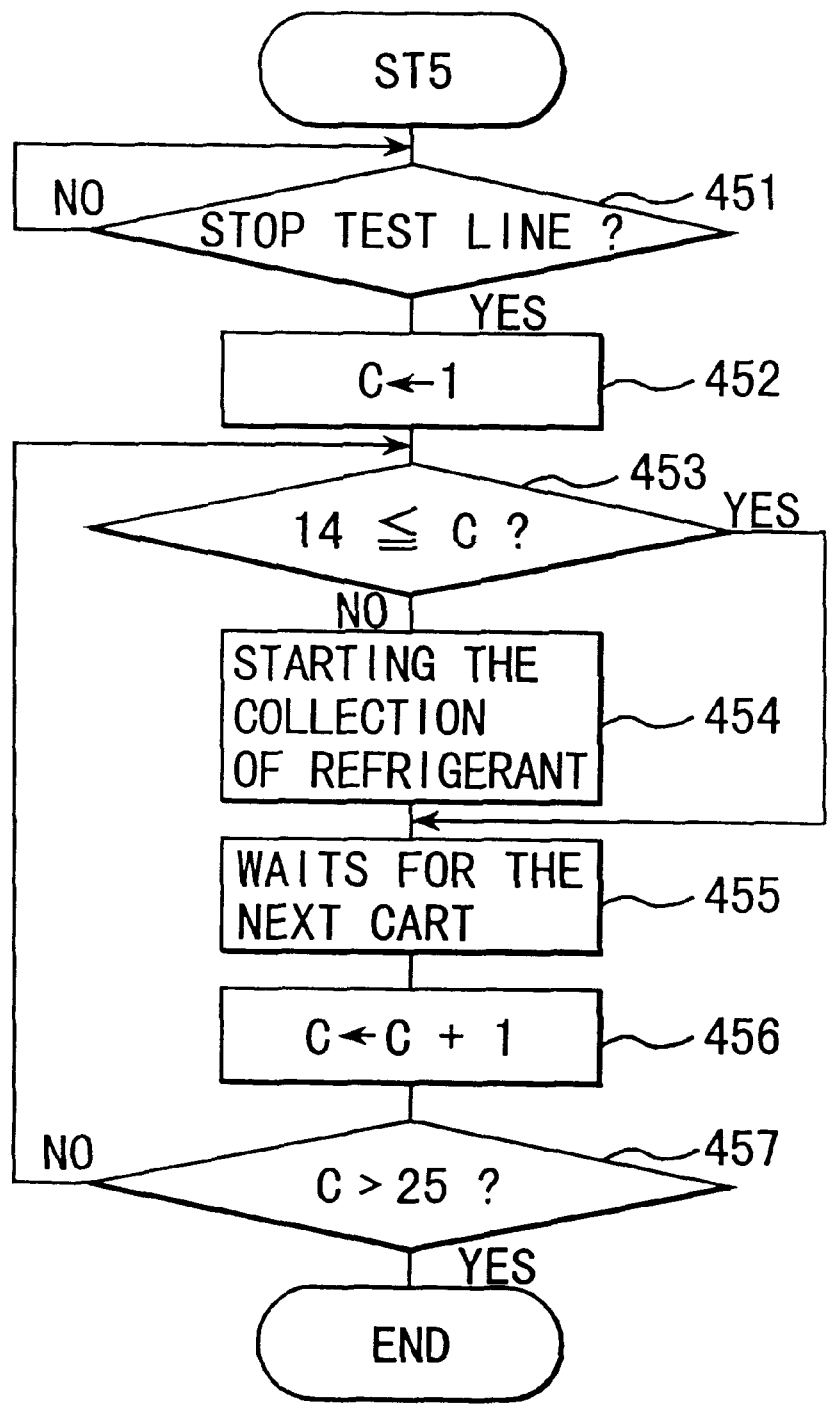
FIG. 23 is a flowchart showing the steps carried out in the post-test station ST5 immediately after the test line is put in the stopping operation.

FIG. 23 shows a procedure carried out in the post-test station ST5 in the stopping operation. There are shown in FIG. 18 fourteen carts numbered "17" through "4" having outdoor units connected with the respective indoor units and awaiting the processing in the station ST5. The cart 17 is under refrigerant recovery process. If the test station ST5 receives the stop instruction from the integration unit PC3, the instruction is detected after the completion of the process for the cart 17 and the next cart 16 is detected (resulting in a decision YES in Step 451), and the counter C is initialized to 1 (Step 452). The procedure advances to Step 453, where a query is made if the value of the counter C is equal to or greater than 14. If the answer is NO, it implies that the outdoor unit EX on the cart 17 has been connected with the associated indoor unit, but not processed yet at the station ST5, so that the recovery process is started with the outdoor unit EX (Step 454). On the other hand, if the answer is YES in the Step 453, the Step 454 is skipped.

The post-test station ST5 then waits for the next cart to arrive (Step 455). When the test station detects the next cart 16, it increments the counter C by 1 (Step 456), and queries the counter C if its value is greater than 25 (Step 457). If the answer is NO, the procedure returns to the Step 453 to repeat the same Steps 453–457 until the answer becomes YES in the Step 457, when the procedure is ended.

Figure 24:
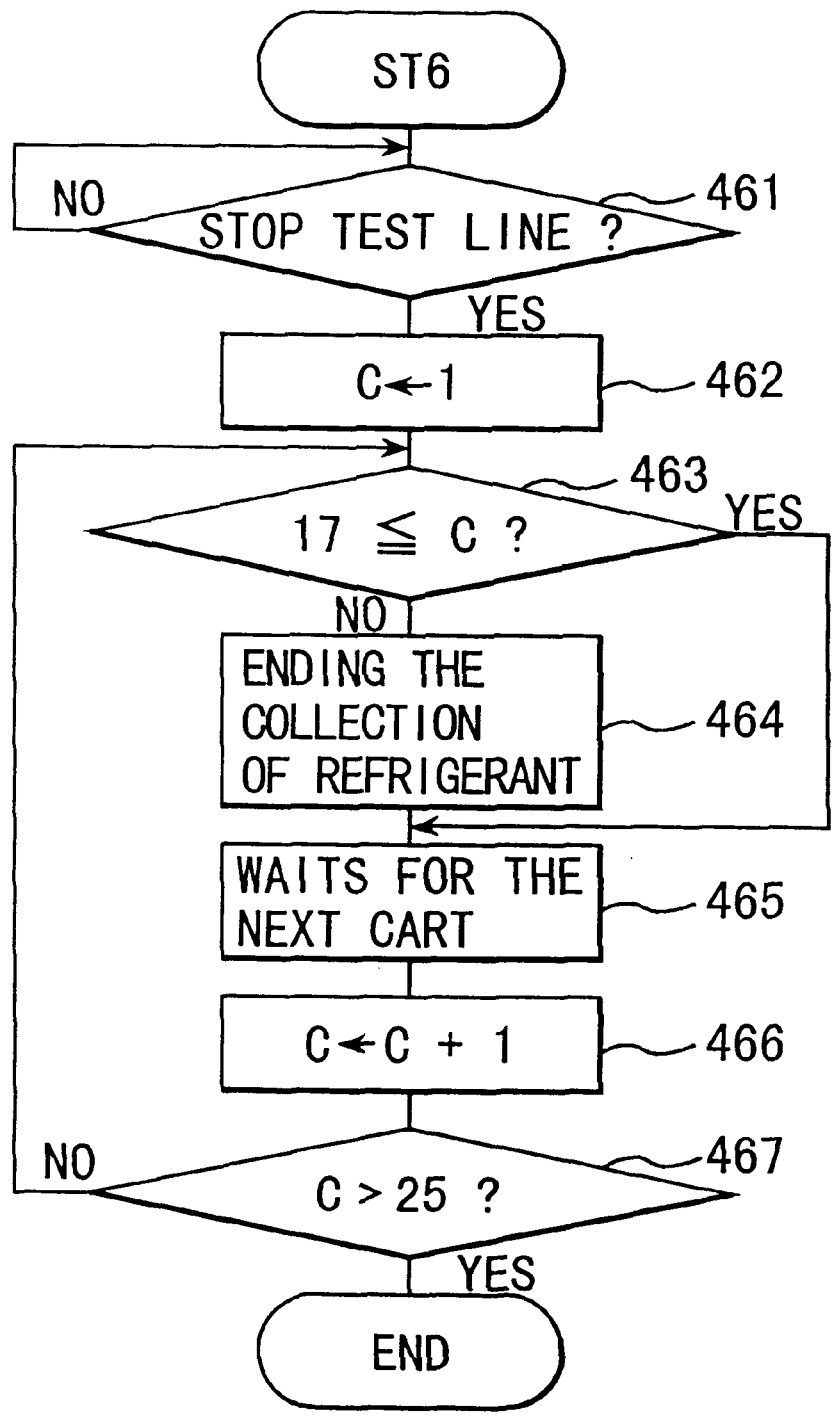
FIG. 24 is a flowchart showing the steps carried out in the post-test station ST6 immediately after the test line is put in the stopping operation.

FIG. 24 shows a procedure carried out in the second post-test station ST6 in the stopping operation. There are shown in FIG. 18 seventeen carts numbered "20" through "4" having outdoor units connected with the respective indoor units and awaiting the processing in the station ST6. The cart 20 is under the second refrigerant recovery process. If the station ST6 receives the stop instruction from the integration unit PC3, the instruction is detected after the completion of the process for the cart 20 and the next cart 19 is detected (resulting in a decision YES in Step 461), and the counter C is initialized to 1 (Step 462). The procedure advances to Step 463, where a query is made if the value of the counter C is equal to or greater than 17. If the answer is NO, it implies that the unit has not been processed yet at the station ST6, so that the second refrigerant recovery process is done for the outdoor unit EX (Step 464). On the other hand, if the answer is YES in the Step 463, the Step 464 is skipped.

The station ST6 then waits for the next cart to arrive (Step 465). When the test station detects the next cart, the counter C is incremented by 1 (Step 466), and queries the counter C if its value is greater than 25 (Step 467). If the answer is NO, the procedure returns to the Step 463 to repeat the same Steps 463–467 until the answer becomes YES in the Step 467, when the procedure is ended.

Figure 25:
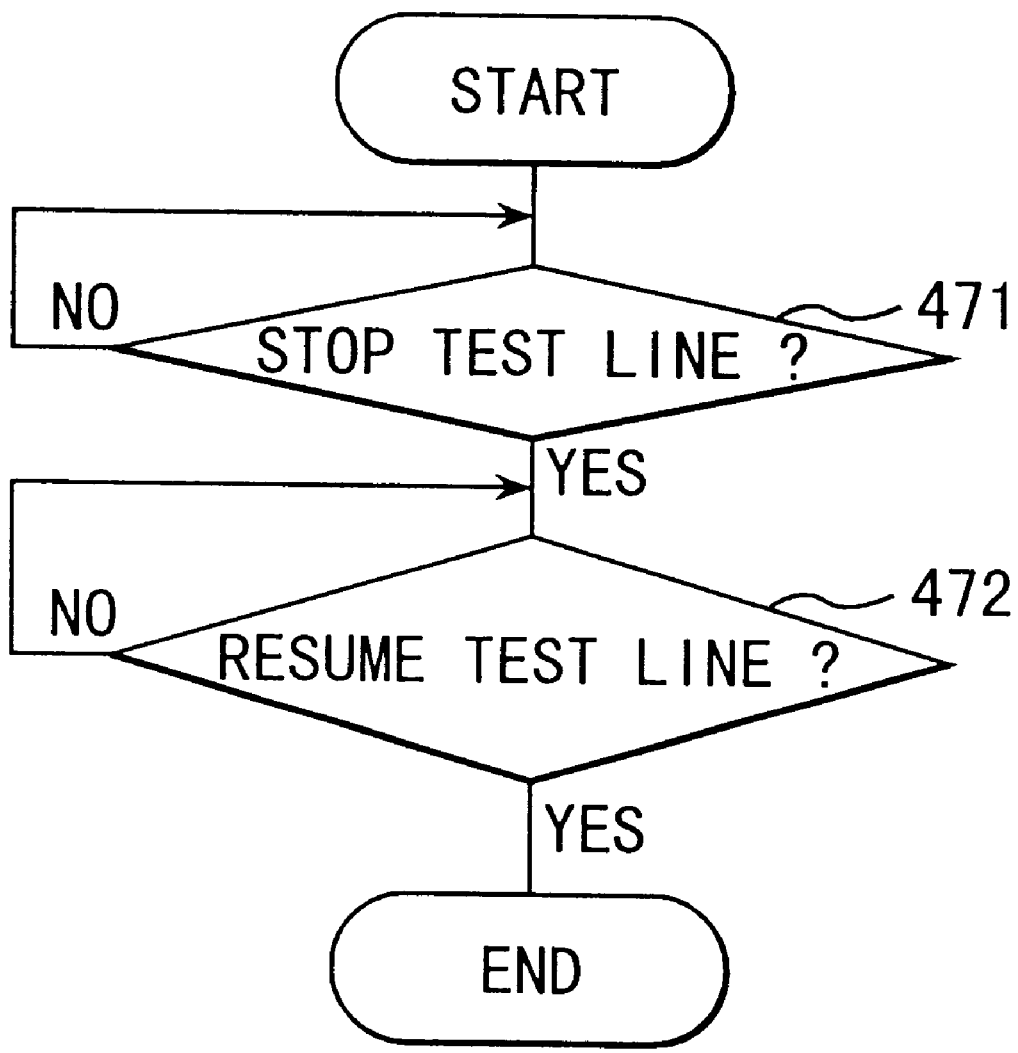
FIG. 25 is a flowchart showing the steps carried out in a general determination unit immediately after the test line is put in the stopping operation.

FIG. 25 shows a procedure carried out in the general determination unit PC2 in the stopping operation. When the general determination unit PC2 receives the stop instruction from the integration unit PC3 (resulting in a decision YES in Step 471), the unit PC2 waits for another instruction that the stopping operation is canceled (resulting in YES in Step 472). While the answer is NO in the Step 472, the unit does nothing. When the answer becomes YES in the Step 472, the integration unit PC3 instructs termination of the operation of the test line.

In summary, the invention permits the test line to undergo a stopping operation in which the conveyer is kept running for a while even after the test line is instructed to stop for a recess for example, thereby carrying the carts and the outdoor units thereon to the test stations and the post-test stations so that the tests and the post-test operations may be completed sequentially for the outdoor units already connected with their indoor units. Consequently, their capacities may be determined in an automated manner, so that the operators may leave the test line to rest.

At the end of the work for the day, the operators may push a stop button and may go home. The test line will be automatically stopped after the completion of the stopping operation described above. It should be noted that all the data pertinent to the outdoor units which have been tested or waiting for the tests on the test line have been stored in the memory devices of the test system, so that the test line may immediately resume the interrupted operation based on the data. The test stations do not test the outdoor units that have been already tested before the resumption, and test only those outdoor units that have been connected with the associated indoor units after the resumption.

Persons skilled in the art would recognize that, in conventional capacity tests of an outdoor unit, measurements of physical quantities such as electric current and refrigerant pressure at the low-pressure end of the compressor must be started only after the transient fluctuations have dumped away and the refrigeration cycles has reached its steady state. This transient period is about six minutes for a refrigeration cycle, so that a capacity test takes a fairly long time. It should be appreciated that, in contrast to such conventional tests, the capacity tests of the invention may be performed even during a transient period by diagnosing the behaviors of the outdoor unit in the transient period, due to the fact that the physical quantities exhibit similar diagnostic symptoms during the transient period in just the same way as in steady state condition. In the example described and shown herein, measurement of the electric current and the refrigerant pressure in a transient period is started 78 seconds after the start up of a cooling mode and 60 seconds after the start up of a heating mode. It should be also appreciated that the measurements are carried out on the test line which is operably connected with an assembly line.

Although the presently preferred embodiment of the invention has been described, it will be understood that various change may be made within the scope of the appended claims. For example, the capacity tests of the invention may be carried out equally well under steady state conditions.

What is claimed is:

1. A test system provided within an assembly line for electric appliances, for carrying out quality tests of said electric appliances, said system comprising:

a test line having an endless conveyer which is provided with a multiplicity of carts, a reception terminal for receiving electric appliances from a first assembly line on which said electric appliances were assembled, and an exit terminal for releasing said appliance to a second assembly line;

means for connecting said import and exit terminals with said first and second assembly lines in response to a run signal instructing the operation of said test line;

test line initiation means for mounting each of said electric appliances received at said reception terminal onto one of said multiplicity of carts and for circulating said carts in discrete steps in response to said run signal;

a multiplicity of test stations located along said endless conveyor, each station adapted to carry out required tests when said appliances are transported to said station;

regulation means for prohibiting repetition of the same test on one electric appliance once said test has been done on said electric appliance in said test line;

means for disconnecting said endless conveyor from said first and second assembly lines in response to a stop signal instructing the stopping of said test line, thereby rendering said conveyor independent in operation from said assembly lines and circulating said electric appliances in said test line; and means for stopping said test line, in response to said stop signal, when each of said electric appliances has made a complete circulation through said test line, starting from the position located at the time of reception of said stop signal.

2. The test system according to claim 1, wherein said test system is adapted to:

provide preparations for fluid and electrical connections necessary for the tests;

provide procedures to carry out said tests;

bring tested electric appliances back to their original conditions subsequent to said tests, collect and store the results of the tests done; and make an overall determination of said tests for each of said electrical appliances based on said results.

3. The test system according to claim 1, wherein each of said carts is provided with an appliance information processor (AIP) unit and a controller, wherein said AIP unit is adapted to:

store information that concerns the electric appliance carried on said cart and is input in a monitor at said reception terminal;

retrieve said information from said AIP unit needed for the test of said appliance;

provide said information to said controller when said cart is detected at one of said test stations so that said controller may control said appliance based on said information;

store said results of said test; and provide said results to a general determination unit at said exit terminal of said test line.

4. The test system according to claim 3, further comprising a radio communication system adapted to exchange data between said test stations and said AIP units and said controllers.

5. The test system according to claim 4, wherein said test line is adapted for testing an outdoor unit of an air conditioner, and wherein each of said cart has an indoor unit having a tube/wire connector for fluid mechanically and electrically connecting said indoor unit with said outdoor door unit when said outdoor unit is mounted on said cart;

said test line having four test stations and two post-test stations such that said outdoor unit is tested at the first test station thereof to see if said outdoor unit has required insulation resistance, at the second test station thereof if said outdoor unit starts up at a low-voltage, at the third test station thereof if said outdoor unit operates in a normal heating mode, and at the fourth test station if said outdoor unit operates in a normal cooling mode, and that at a fist one of said post-test stations the refrigerant of said outdoor unit is recovered from said indoor unit, and at the second one of said post-test stations said outdoor unit is stopped, and thereafter said tube/wire connector is disconnected from said outdoor unit.

* * * * *